US011929380B2

(12) United States Patent
Tanaka et al.

(10) Patent No.: US 11,929,380 B2
(45) Date of Patent: Mar. 12, 2024

(54) SOLID-STATE IMAGE-CAPTURING ELEMENT HAVING FLOATION DIFFUSION AND HOLLOW REGIONS

(71) Applicant: SONY SEMICONDUCTOR SOLUTIONS CORPORATION, Kanagawa (JP)

(72) Inventors: Yusuke Tanaka, Kanagawa (JP); Takashi Nagano, Kanagawa (JP); Toshifumi Wakano, Kanagawa (JP); Takeshi Matsunuma, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/501,135

(22) Filed: Oct. 14, 2021

(65) Prior Publication Data
US 2022/0037389 A1 Feb. 3, 2022

Related U.S. Application Data

(63) Continuation of application No. 17/015,291, filed on Sep. 9, 2020, now Pat. No. 11,183,528, which is a
(Continued)

(30) Foreign Application Priority Data

Mar. 31, 2015 (JP) ................................. 2015-071024
Oct. 8, 2015 (JP) ................................. 2015-200339

(51) Int. Cl.
H01L 27/14 (2006.01)
H01L 27/146 (2006.01)
(Continued)

(52) U.S. Cl.
CPC .. *H01L 27/14636* (2013.01); *H01L 27/14603* (2013.01); *H01L 27/14612* (2013.01);
(Continued)

(58) Field of Classification Search
CPC ......... H01L 27/14636; H01L 27/14603; H01L 27/14612; H01L 27/14634;
(Continued)

(56) References Cited

U.S. PATENT DOCUMENTS 3,890,636 A * 6/1975 Harada ............... H01L 21/7682
257/776
4,441,791 A * 4/1984 Hornbeck ............... G09F 9/372
359/295
(Continued)

FOREIGN PATENT DOCUMENTS

CN 101290944 A 10/2008
CN 101908525 A 12/2010
(Continued)

OTHER PUBLICATIONS

Office Action for CN Application No. 201680015741, dated Dec. 17, 2020.
(Continued)

*Primary Examiner* — Ida M Soward
(74) *Attorney, Agent, or Firm* — CHIP LAW GROUP

(57) ABSTRACT

There is provided a solid-state image-capturing element capable of reducing the capacitance by using a hollow region. At least a part of a region between an FD wiring connected to a floating diffusion and a wiring other than the FD wiring is a hollow region. The present disclosure can be applied to a CMOS image sensor having, for example, a floating diffusion, a transfer transistor, an amplifying transistor, a selection transistor, a reset transistor, and a photodiode.

12 Claims, 36 Drawing Sheets

Related U.S. Application Data continuation of application No. 16/507,663, filed on Jul. 10, 2019, now Pat. No. 10,797,097, which is a continuation of application No. 15/556,902, filed as application No. PCT/JP2016/058453 on Mar. 17, 2016, now Pat. No. 10,396,116.

(51) Int. Cl.

| | | |
|---|---|---|
| *H01L 29/78* | (2006.01) | |
| *H04N 25/62* | (2023.01) | |
| *H04N 25/70* | (2023.01) | |
| *H04N 25/79* | (2023.01) | |
| *H01L 29/06* | (2006.01) | |
| *H01L 29/49* | (2006.01) | |
| *H01L 29/51* | (2006.01) | |
| *H04N 25/75* | (2023.01) | |
| *H04N 25/76* | (2023.01) | |
| *H10B 12/00* | (2023.01) | |

(52) U.S. Cl.
CPC .. *H01L 27/14634* (2013.01); *H01L 27/14641* (2013.01); *H01L 27/14683* (2013.01); *H01L 27/1469* (2013.01); *H04N 25/62* (2023.01); *H04N 25/70* (2023.01); *H04N 25/79* (2023.01); *H01L 27/14643* (2013.01); *H01L 27/14649* (2013.01); *H01L 27/14689* (2013.01); *H01L 29/0649* (2013.01); *H01L 29/4991* (2013.01); *H01L 29/515* (2013.01); *H01L 29/7841* (2013.01); *H04N 25/75* (2023.01); *H04N 25/76* (2023.01); *H10B 12/20* (2023.02)

(58) Field of Classification Search
CPC ........... H01L 27/14641; H01L 27/1469; H01L 27/10802; H01L 27/14669; H01L 27/14689; H01L 27/14643; H01L 27/14649; H01L 29/0649; H01L 29/4991; H01L 29/7841; H01B 12/20
See application file for complete search history.

(56) References Cited

U.S. PATENT DOCUMENTS

| | | | |
|---|---|---|---|
| 5,008,734 A | 4/1991 | Dutta et al. | |
| 5,034,799 A * | 7/1991 | Tomita | H01L 23/5226 257/773 |
| 5,393,709 A | 2/1995 | Lur | |
| 5,882,963 A * | 3/1999 | Kerber | H01L 21/7682 438/622 |
| 5,883,779 A * | 3/1999 | Catanescu | G01L 9/0073 361/283.4 |
| 6,022,802 A * | 2/2000 | Jang | H01L 21/7682 257/E21.573 |
| 6,146,985 A * | 11/2000 | Wollesen | H01L 24/05 438/618 |
| 6,246,118 B1 * | 6/2001 | Buynoski | H01L 24/05 257/776 |
| 6,281,585 B1 * | 8/2001 | Bothra | H01L 23/5226 257/788 |
| 6,284,675 B1 | 9/2001 | Jin | |
| 6,297,554 B1 * | 10/2001 | Lin | H01L 21/76831 257/E21.579 |
| 6,379,990 B1 * | 4/2002 | Muller | B81C 1/00158 438/495 |
| 6,403,461 B1 * | 6/2002 | Tae | H01L 21/7682 257/E21.589 |
| 6,995,470 B2 * | 2/2006 | Ahn | H01L 21/76879 257/E21.589 |
| 7,800,146 B2 | 9/2010 | McKee et al. | |
| 8,034,693 B2 | 10/2011 | Shibata et al. | |
| 8,242,014 B2 * | 8/2012 | Usami | H01L 23/53295 257/E21.589 |
| 8,247,902 B2 * | 8/2012 | Noguchi | H01L 21/76834 257/E21.573 |
| 8,294,194 B2 * | 10/2012 | Noda | H01L 27/11529 257/305 |
| 8,865,562 B2 * | 10/2014 | Lee | H01L 27/11524 438/422 |
| 9,064,935 B2 * | 6/2015 | Tang | H01L 21/7682 |
| 9,368,395 B1 * | 6/2016 | Wei | H01L 21/7682 |
| 9,595,557 B2 | 3/2017 | Yanagita et al. | |
| 9,602,746 B2 | 3/2017 | Miyanami | |
| 2007/0184615 A1 | 8/2007 | Brazzelli et al. | |
| 2008/0258250 A1 | 10/2008 | Uenishi | |
| 2009/0263951 A1 * | 10/2009 | Shibata | H01L 23/5222 257/E21.573 |
| 2010/0308430 A1 | 12/2010 | Aoki | |
| 2011/0233702 A1 | 9/2011 | Takahashi et al. | |
| 2013/0122644 A1 | 5/2013 | Aoki | |
| 2013/0320475 A1 | 12/2013 | Takahashi et al. | |
| 2014/0239362 A1 | 8/2014 | Koo et al. | |
| 2015/0054054 A1 | 2/2015 | Ahn et al. | |
| 2015/0108599 A1 | 4/2015 | Takahashi et al. | |
| 2015/0325519 A1 | 11/2015 | Peek et al. | |
| 2016/0027727 A1 * | 1/2016 | Kim | H01L 27/10823 257/774 |
| 2016/0254225 A1 * | 9/2016 | Lu | H01L 23/53266 257/751 |
| 2016/0284755 A1 | 9/2016 | Shimotsusa | |
| 2018/0158852 A1 | 6/2018 | Sato | |
| 2019/0157325 A1 | 5/2019 | Shinohara | |

FOREIGN PATENT DOCUMENTS

| | | |
|---|---|---|
| CN | 102201418 A | 9/2011 |
| CN | 105409002 A | 3/2016 |
| EP | 2261968 A1 | 12/2010 |
| EP | 2842164 A1 | 3/2015 |
| JP | 63-098134 B | 4/1988 |
| JP | 2007-184788 A | 7/2007 |
| JP | 2008-270500 A | 11/2008 |
| JP | 2009-123743 A | 6/2009 |
| JP | 2011-166033 A | 6/2009 |
| JP | 2009-295733 A | 12/2009 |
| JP | 2010-232284 A | 10/2010 |
| JP | 2010-283307 A | 12/2010 |
| JP | 2011166033 A | 8/2011 |
| JP | 2011-187751 A | 9/2011 |
| JP | 2011-204915 A | 10/2011 |
| JP | 2011-243882 A | 12/2011 |
| JP | 2012-191116 A | 10/2012 |
| JP | 2014-143399 A | 8/2014 |
| JP | 2015-038931 A | 2/2015 |
| JP | 2015-050478 A | 3/2015 |
| KR | 10-0983550 B1 | 9/2010 |
| KR | 10-2011-0107747 A | 10/2011 |
| TW | 201201368 A | 1/2012 |
| WO | 2009/063591 A1 | 5/2009 |
| WO | 2009/231501 A1 | 10/2009 |
| WO | 2013046972 A1 | 4/2013 |
| WO | 2013/159807 A1 | 10/2013 |
| WO | 2015/025723 A1 | 2/2015 |

OTHER PUBLICATIONS

Office Action for JP Patent Application No. 2015-200339, dated Jun. 23, 2020, 08 pages of Office Action and 06 pages of English Translation.

Notice of Allowance for U.S. Appl. No. 16/507,663, dated Jun. 2, 2020, 9 pages.

Non-Final Office Action for U.S. Appl. No. 15/556,902, dated Sep. 10, 2018, 06 pages.

Notice of Allowance for U.S. Appl. No. 15/556,902, dated Apr. 15, 2019, 05 pages.

International Search Report and Written Opinion of PCT Application No. PCT/JP2016/058453, dated May 17, 2016, 12 pages of English Translation and 10 pages of ISRWO.

(56) References Cited

OTHER PUBLICATIONS

International Preliminary Report on Patentability of PCT Application No. PCT/JP2016/058453, dated Oct. 12, 2017, 11 pages of English Translation and 06 pages of IPRP.
Office Action for JP Patent Application No. 2015-200339, dated Dec. 3, 2019, 09 pages of Office Action and 07 pages of English Translation.
Notice of Allowance for U.S. Appl. No. 17/015,291, dated Jul. 30, 2021, 9 pages.
Non-Final Office Action for U.S. Appl. No. 17/430,046 dated Jan. 25, 2023.
Final Office Action for U.S. Appl. No. 17/530,046 dated Jul. 19, 2023.
Non-Final Office Action for U.S. Appl. No. 17/530,046 dated Dec. 11, 2023.

* cited by examiner

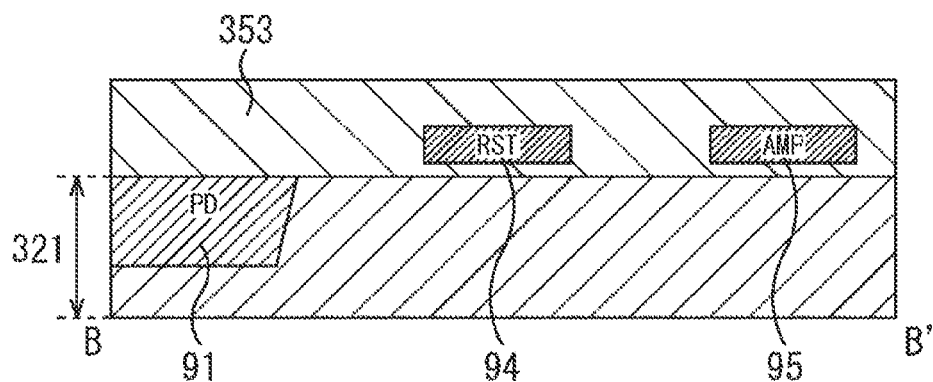
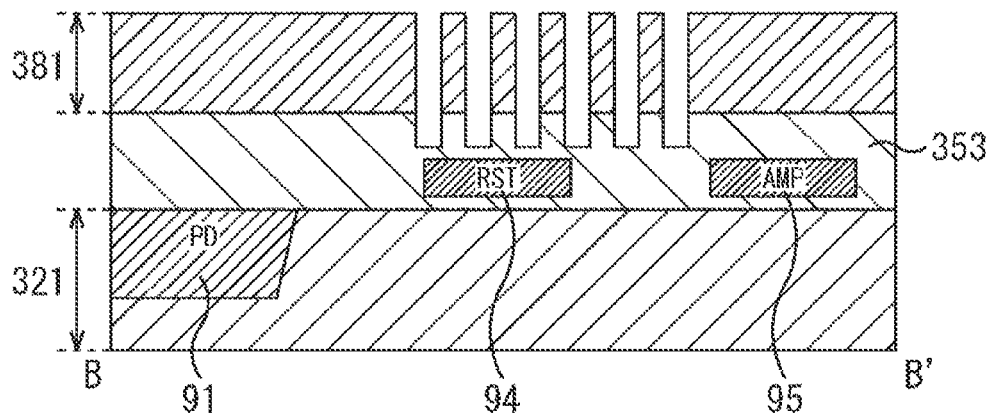
FIG. 11

FIG. 12
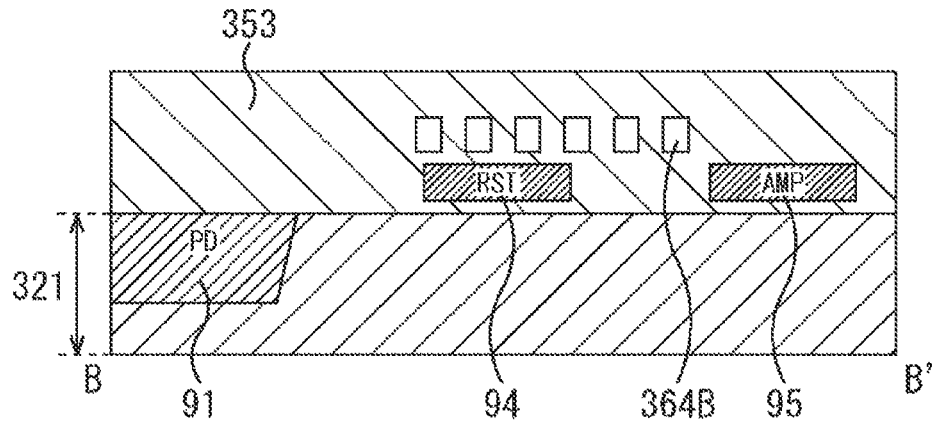
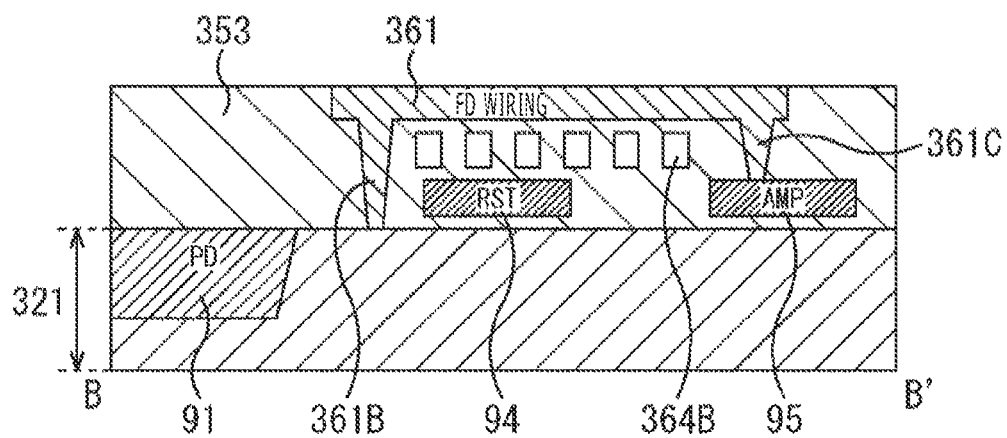
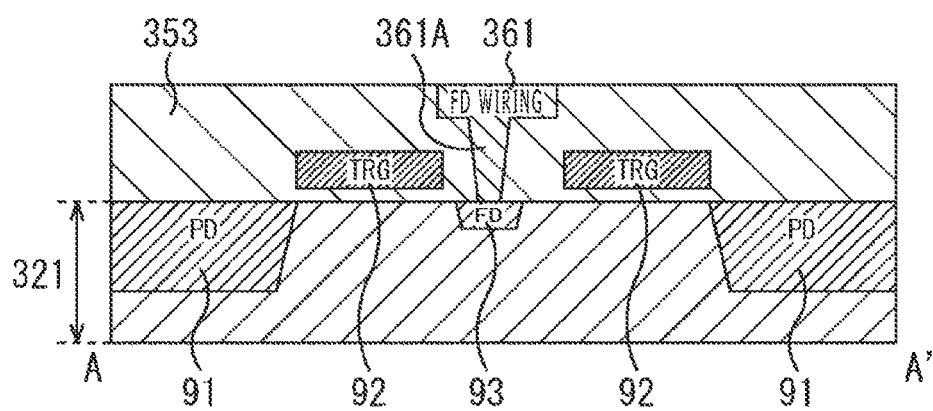

FIG. 13
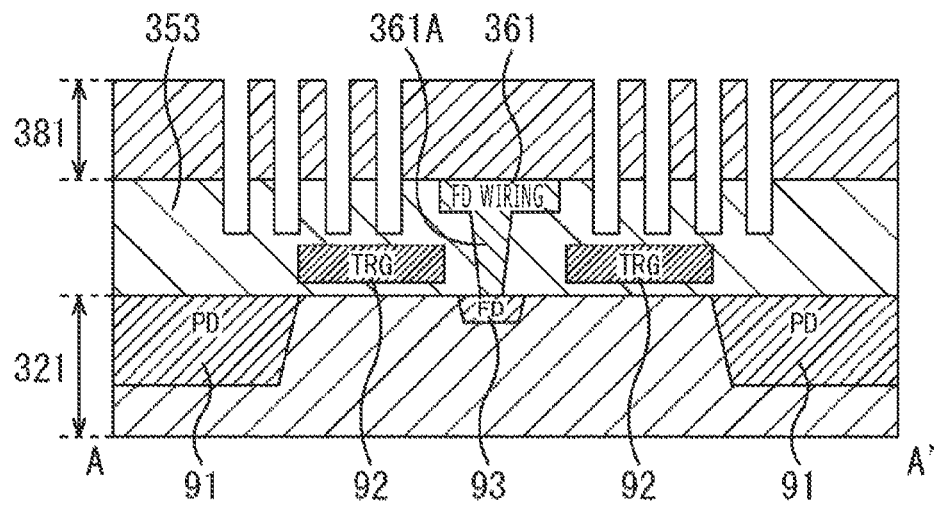
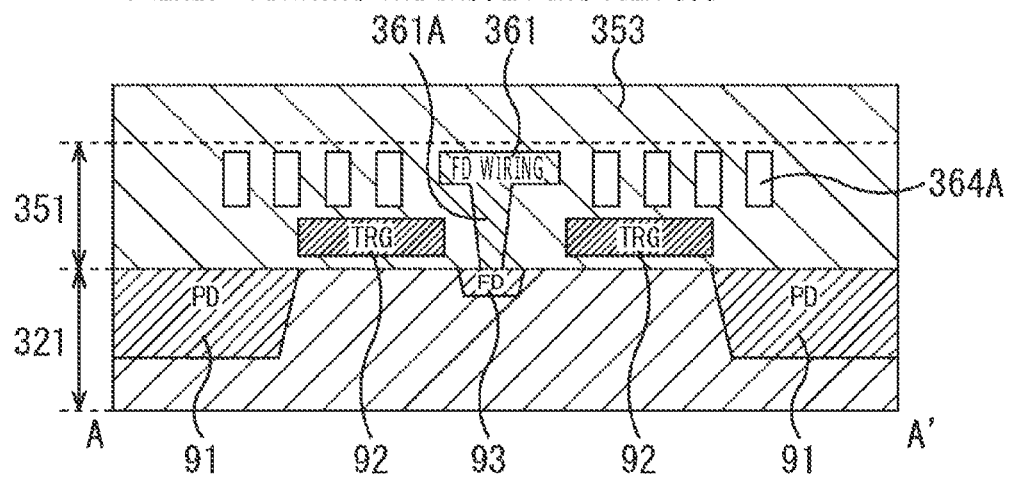

FIG. 14
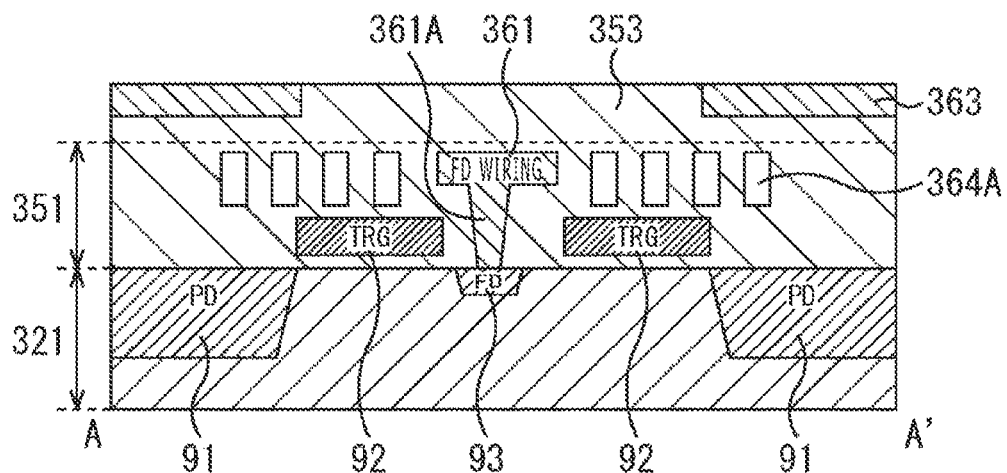
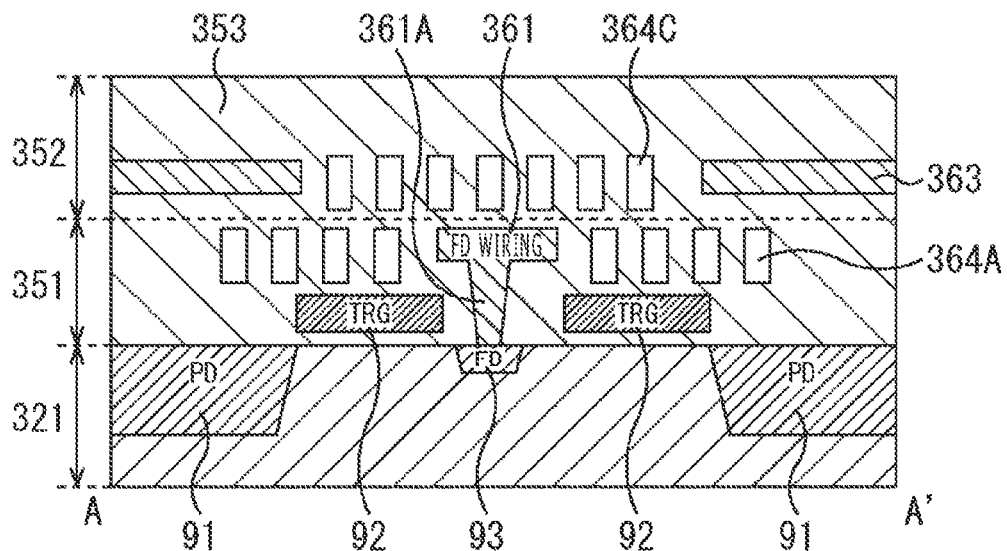

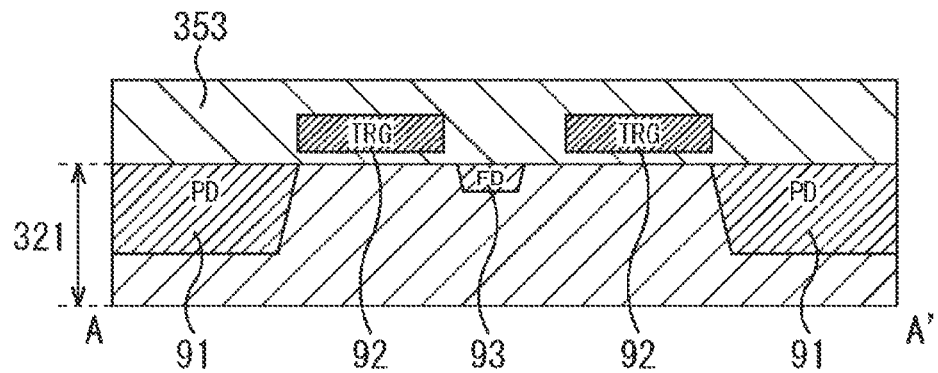
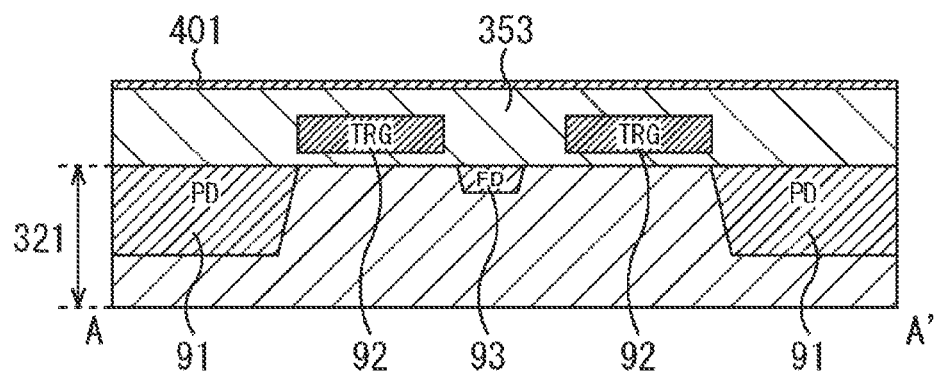
FIG. 16

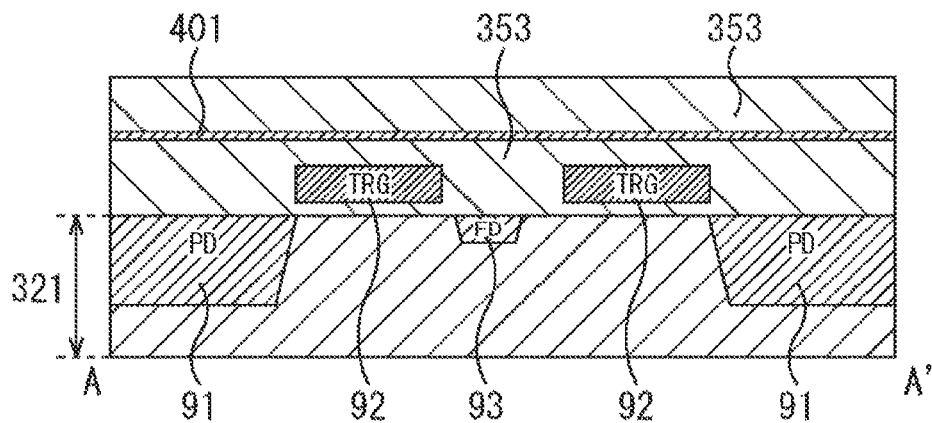
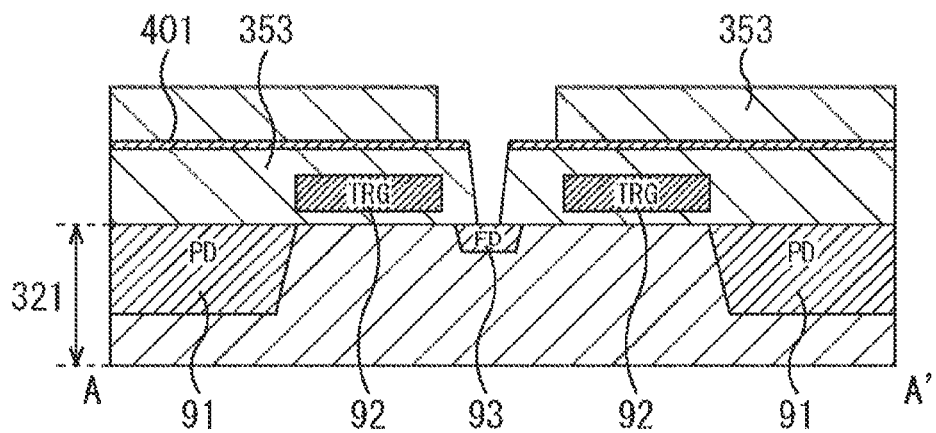
FIG. 17

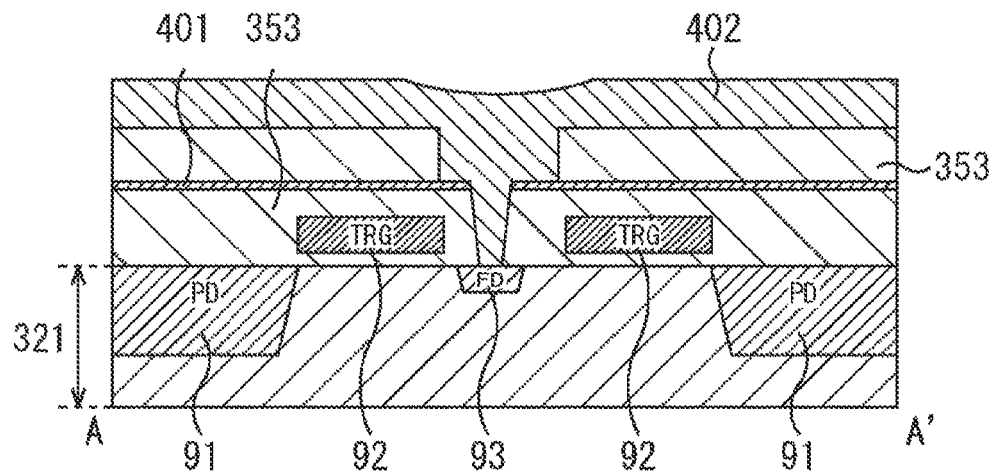
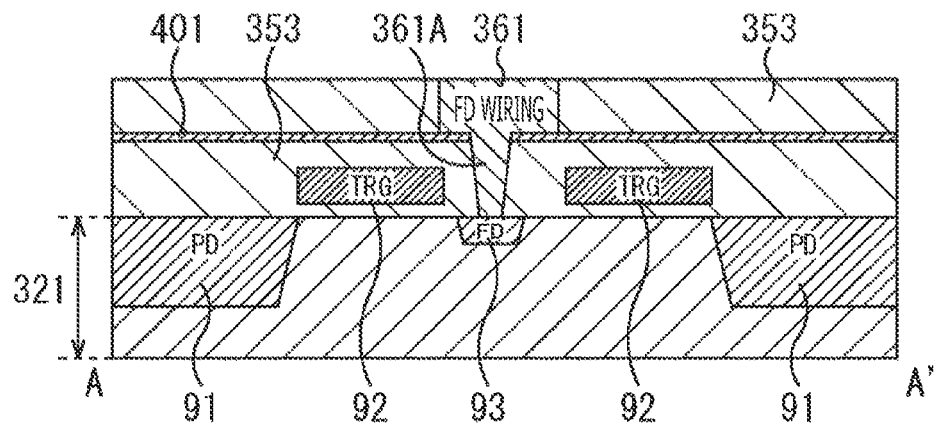
FIG. 18

FIG. 22
(1) THE FD WIRING 361 IS FORMED BY A DAMASCENE METHOD
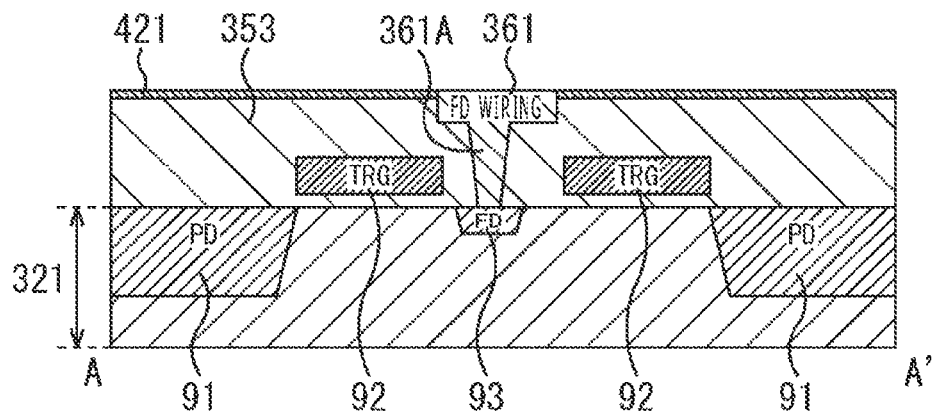
(2) THE INSULATING FILMS 353 AND 421 ARE ETCHED USING A PHOTORESIST PATTERN
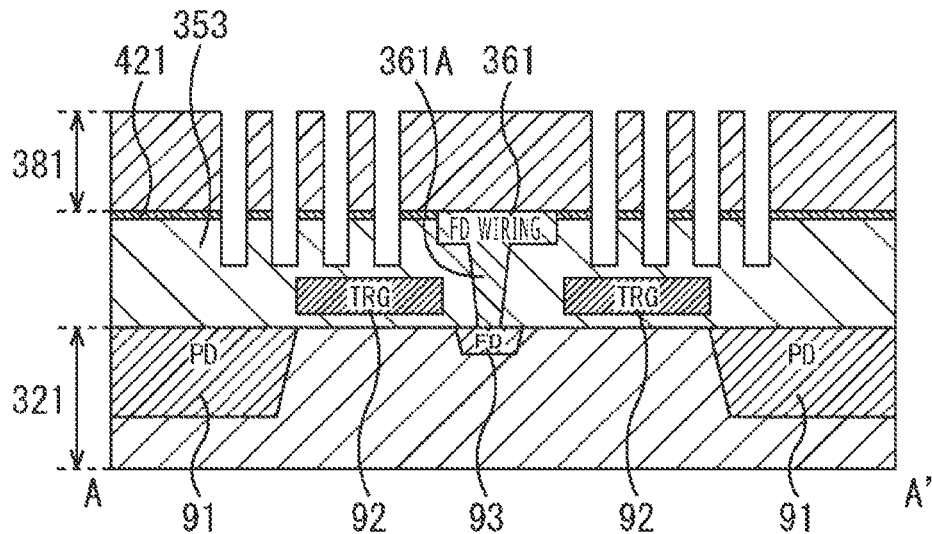

FIG. 23
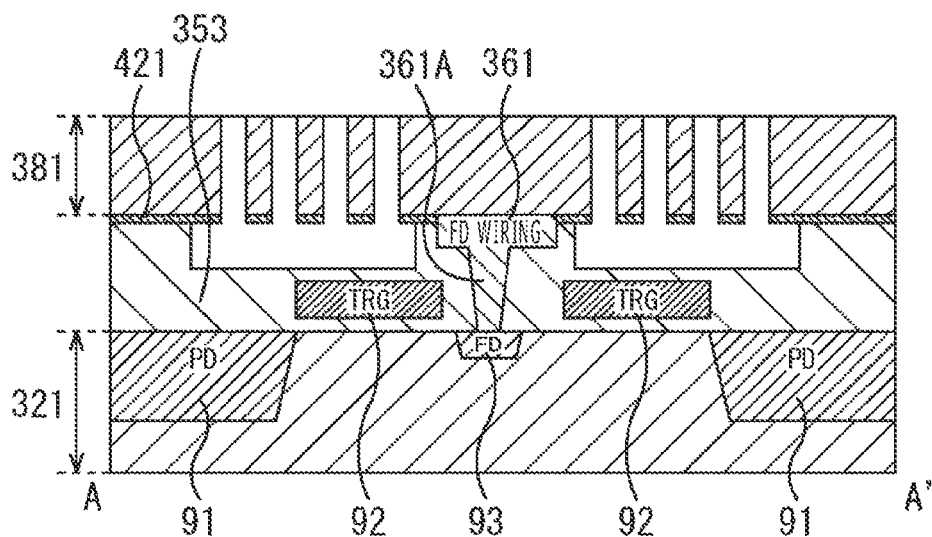
(3) ONLY THE INSULATING FILM 353 IS ETCHED BY ISOTROPIC ETCHING, THEREBY CONNECTING THE LOWER PARTS OF THE HOLLOW REGIONS 364A TOGETHER
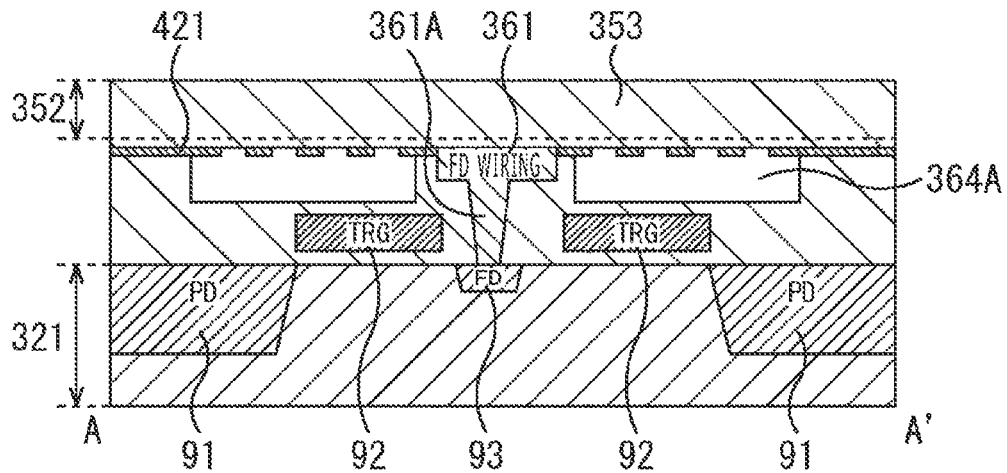
(4) THE PHOTORESIST PATTERN IS PEELED OFF, THEREBY FORMING THE INSULATING FILM 353

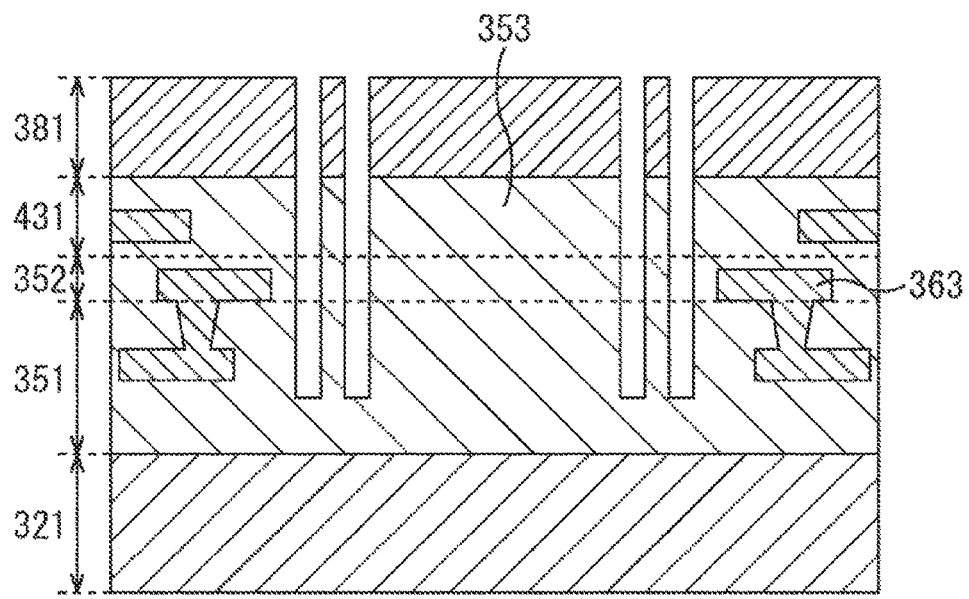
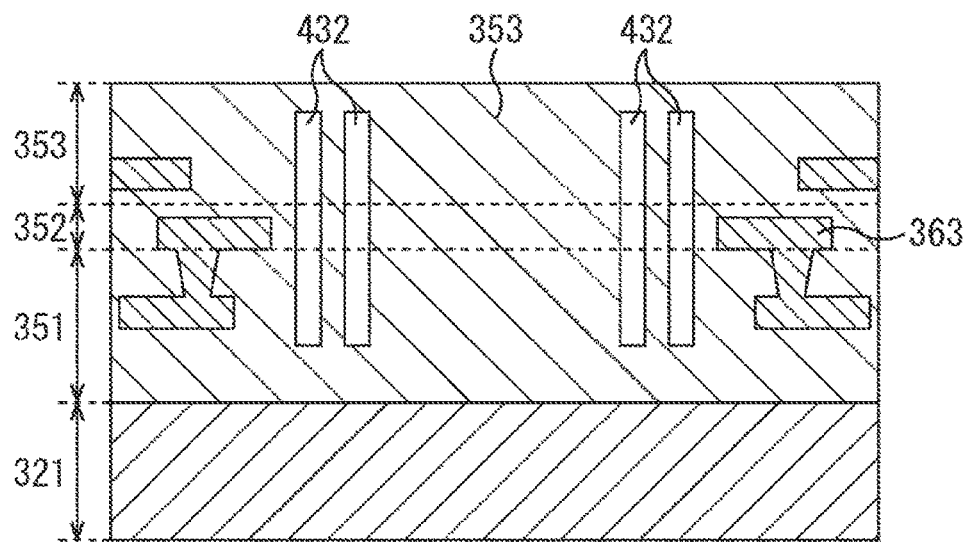
FIG. 25

SOLID-STATE IMAGE-CAPTURING ELEMENT HAVING FLOATION DIFFUSION AND HOLLOW REGIONS

CROSS-REFERENCE TO RELATED APPLICATION

The present application is a continuation application of U.S. patent application Ser. No. 17/015,291, filed on Sep. 9, 2020, which is a continuation application of U.S. patent application Ser. No. 16/507,663, filed on Jul. 10, 2019, now U.S. Pat. No. 10,797,097, which is a continuation application of U.S. patent application Ser. No. 15/556,902, filed on Sep. 8, 2017, now U.S. Pat. No. 10,396,116, which is a national stage entry of PCT/JP2016/05845, filed on Mar. 17, 2016, which claims priority from prior Japanese Priority Patent Application JP 2015-071024 filed in the Japan Patent Office on Mar. 31, 2015, and Japanese Priority Patent Application JP 2015-200339 filed in the Japan Patent Office on Oct. 8, 2015, the entire contents of which are hereby incorporated by reference.

TECHNICAL FIELD

The present disclosure relates to a solid-state image-capturing element and an electronic device, and more particularly relates to a solid-state image-capturing element and an electronic device capable of reducing the capacitance by using a hollow region.

BACKGROUND ART

In a complementary metal-oxide semiconductor (CMOS) image sensor, when miniaturization of pixels progresses, the opening area of a photodiode is reduced, and sensitivity is lowered. Further, the size of a pixel transistor is reduced, and random noise is worsened. As a result, signal/noise (S/N) ratio is lowered and image quality is degraded.

Therefore, it has been proposed to improve the S/N ratio by reducing the parasitic capacitance of a floating diffusion (FD) and improving the charge-voltage conversion efficiency.

The parasitic capacitance of the FD includes diffusion capacitance of the FD, capacitance of the gate electrode of an amplifying transistor connected to the FD through an FD wiring, capacitance of the FD wiring, and any other capacitance. The diffusion capacitance of the FD can be reduced by lowering the concentration of the N-type impurity of the FD. However, in this case, there is concern about a contact failure.

The capacitance of the gate electrode of the amplifying transistor can be reduced by reducing the size of the amplifying transistor. However, when the size of the amplifying transistor is reduced, random noise is worsened.

Further, the capacitance of the FD wiring can be reduced to some extent by devising a wiring layout. However, because the FD needs to be connected to the amplifying transistor, the wiring layout is limited based on a sharing system of pixels. Therefore, reducing the capacitance of the FD wiring by devising the wiring layout is difficult.

Therefore, there has been proposed a method of reducing the capacitance of the FD wiring by changing the entire periphery of the wiring layer to a low dielectric constant film (for example, refer to PTL 1).

CITATION LIST

Patent Literature

[PTL 1]
JP 2009-231501 A

SUMMARY

Technical Problem

As a method of reducing the capacitance, a method other than the method described in PTL 1 is desired.

The present disclosure has been made in view of such a situation, and makes it possible to reduce the capacitance by using a hollow region.

Solution to Problem

A solid-state image-capturing element according to one aspect of the present disclosure is a solid-state image-capturing element in which at least a part of a region between an FD wiring connected to a floating diffusion and a wiring other than the FD wiring is a hollow region.

An electronic device according to one aspect of the present disclosure corresponds to the solid-state image-capturing element of the one aspect of the present disclosure.

According to one aspect of the present disclosure, at least a part of a region between an FD wiring connected to a floating diffusion and a wiring other than the FD wiring is a hollow region.

Advantageous Effects of Invention

According to one aspect of the present disclosure, capacitance can be reduced. Further, according to one aspect of the present disclosure, the capacitance can be reduced using a hollow region.

The advantageous effects described in the present disclosure are not necessarily limited, and may be any of the effects described in the present disclosure.

BRIEF DESCRIPTION OF DRAWINGS

FIG. 11 is a diagram for describing a method of manufacturing a semiconductor substrate in FIGS. 9 and 10.

FIG. 12 is a diagram for describing the method of manufacturing the semiconductor substrate in FIGS. 9 and 10.

FIG. 13 is a diagram for describing the method of manufacturing the semiconductor substrate in FIGS. 9 and 10.

FIG. 14 is a diagram for describing the method of manufacturing the semiconductor substrate in FIGS. 9 and 10.

FIG. 16 is a diagram for describing a method of manufacturing a semiconductor substrate in FIG. 15.

FIG. 17 is a diagram for describing the method of manufacturing the semiconductor substrate in FIG. 15.

FIG. 18 is a diagram for describing the method of manufacturing the semiconductor substrate in FIG. 15.

FIG. 22 is a diagram for describing a method of manufacturing a semiconductor substrate in FIG. 21.

FIG. 23 is a diagram for describing the method of manufacturing the semiconductor substrate in FIG. 21.

FIG. 25 is a diagram for describing a first method of manufacturing the CMOS image sensor in FIG. 8.

DESCRIPTION OF EMBODIMENTS

Hereinafter, modes for carrying out the present disclosure (hereinafter, referred to as embodiments) will be described. The description will be made in the following order.

1. First embodiment: CMOS image sensor (FIG. 1 to FIG. 6)
2. Second embodiment: CMOS image sensor (FIG. 7)
3. Third embodiment: CMOS image sensor (FIG. 8 to FIG. 32)
4. Fourth embodiment: CMOS image sensor (FIGS. 33A, 33B, 34A, 34B, 35A, 35B, and 35C)
5. Fifth embodiment: Electronic device (FIG. 36)
6. Example of usage of CMOS image sensor (FIG. 37)

First Embodiment (Configuration Example of CMOS Image Sensor According to First Embodiment)

Figure 1:
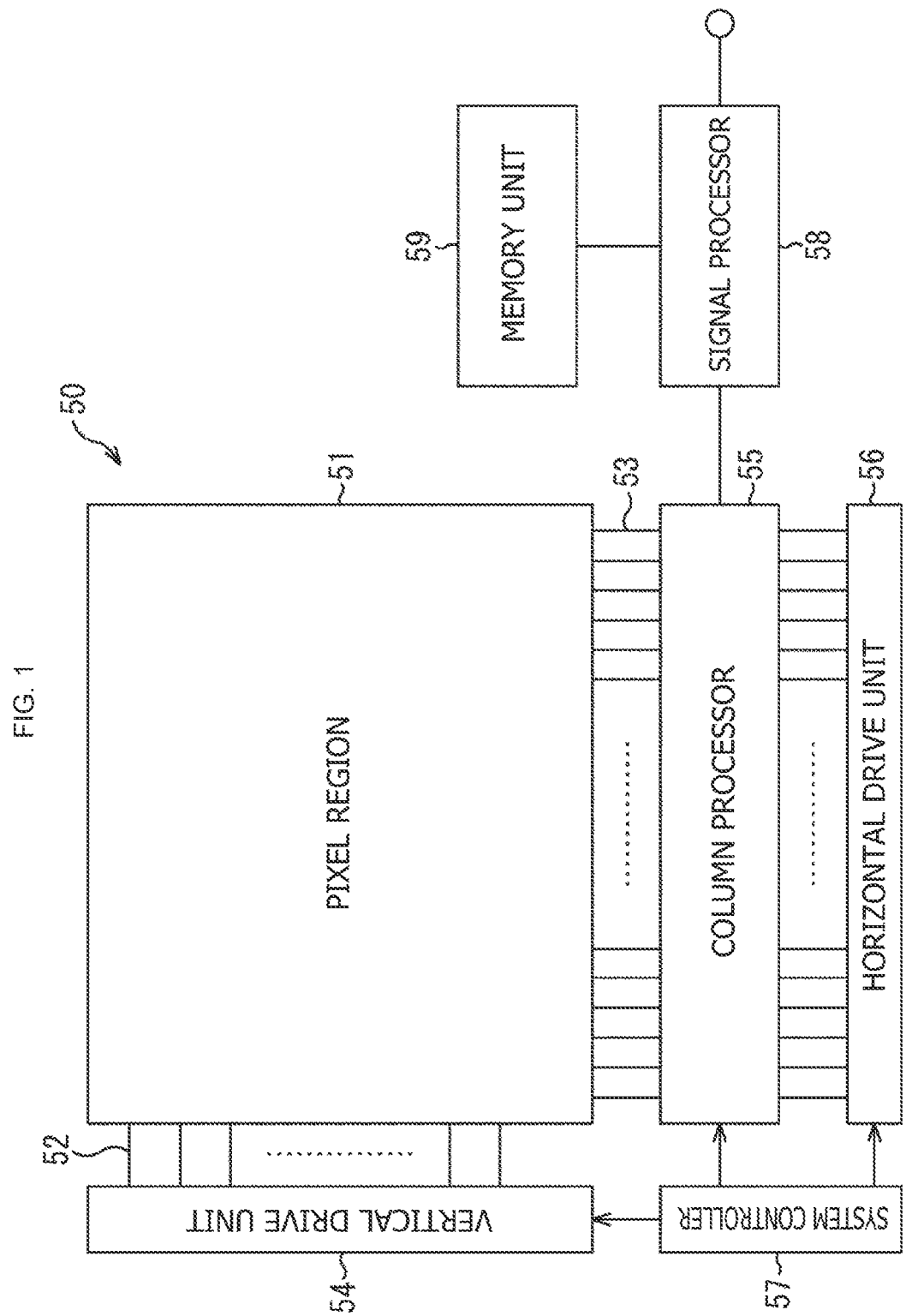
FIG. 1 is a diagram depicting a configuration example of a CMOS image sensor as a solid-state image-capturing element according to a first embodiment of the present disclosure.

FIG. 1 is a diagram depicting a configuration example of a CMOS image sensor as a solid-state image-capturing element according to a first embodiment of the present disclosure.

A CMOS image sensor 50 includes a pixel region 51, pixel drive lines 52, vertical signal lines 53, a vertical drive unit 54, a column processor 55, a horizontal drive unit 56, a system controller 57, a signal processor 58, and a memory unit 59, which are all formed on a semiconductor substrate (a chip) such as a silicon substrate not depicted.

The pixel region 51 of the CMOS image sensor 50 includes pixels that are two-dimensionally arranged in a matrix shape, each pixel having a photoelectric conversion element that generates charges of a charge amount corresponding to the amount of incident light and accumulates the charges inside the photoelectric conversion element, so that the CMOS image sensor 50 performs image capturing. Further, in the pixel region 51, the pixel drive line 52 is formed for each row, and the vertical signal line 53 is formed for each column, for the pixels that are in the matrix shape.

The vertical drive unit 54 includes a shift register, an address decoder, or any other unit, and drives each pixel of the pixel region 51 in row unit. To the output end not depicted corresponding to each row of the vertical drive unit 54, one end of the pixel drive line 52 is connected. While a detailed configuration of the vertical drive unit 54 is not depicted, the vertical drive unit 54 has two scanning systems of a readout scanning system and a sweep scanning system.

The readout scanning system sequentially selects rows to sequentially read pixel signals in row unit from each pixel, and outputs selected signals from the output end connected to the pixel drive line 52 of the selected row. With this arrangement, pixels of the row selected by the readout scanning system are read as pixel signals which are electric signals of charges accumulated in the photoelectric conversion element. The readout scanning system supplies the pixel signals to the vertical signal line 53.

The sweep scanning system turns on a reset signal that is output from the output end connected to the pixel drive line 52 of each row, in order to sweep (reset) unnecessary charges from the photoelectric conversion element. By the scanning by the sweep scanning system, a so-called electronic shutter operation is sequentially performed for each row. In this case, the electronic shutter operation is the operation of discarding charges of the photoelectric conversion element and starting new exposure (starting accumulation of charges).

The column processor 55 includes a signal processing circuit for each column of the pixel region 51. Each signal processing circuit of the column processor 55 performs signal processing such as an analog/digital (A/D) conversion process to a pixel signal output from each pixel of a selected row through the vertical signal line 53. The column processor 55 temporarily holds the pixel signals after the signal processing.

The horizontal drive unit 56 includes a shift register, an address decoder, or any other unit, and sequentially selects the signal processing circuits of the column processor 55, Based on selective scanning by the horizontal drive unit 56, pixel signals processed by each signal processing circuit of the column processor 55 are sequentially output to the signal processor 58.

The system controller 57 includes a timing generator or any other unit that generates various timing signals. The system controller 57 controls the vertical drive unit 54, the column processor 55, and the horizontal drive unit 56, based on various timing signals generated by the timing generator.

The signal processor 58 performs various signal processing to the pixel signals output from the column processor 55. At this time, the signal processor 58 stores an intermediate result of the signal processing in the memory unit 59, when necessary, and refers to the memory unit 59 at a necessary timing. The signal processor 58 outputs a pixel signal after the signal processing.

The memory unit 59 includes a dynamic random access memory (DRAM) or a static random access memory (SRAM).

(Example of Circuit Configuration of Pixel)

Figure 2:
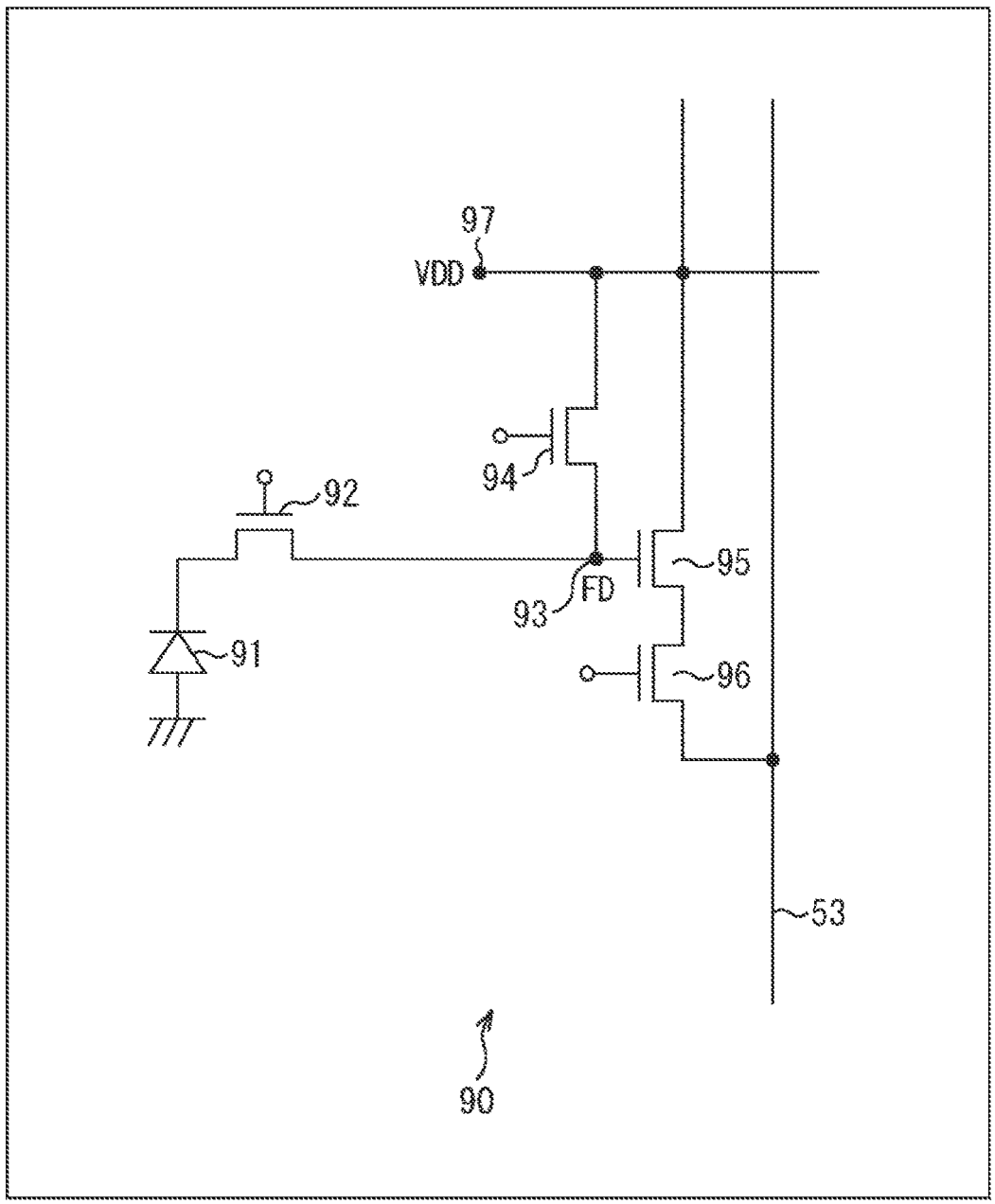
FIG. 2 is a diagram depicting an example of a circuit configuration of one of pixels arranged two-dimensionally in a pixel region in FIG. 1.

FIG. 2 is a diagram depicting an example of a circuit configuration of one of pixels arranged two-dimensionally in the pixel region 51 in FIG. 1.

A pixel 90 has a photodiode 91 as a photoelectric conversion element, a transfer transistor (TRG) 92, an FD 93, a reset transistor 94, an amplifying transistor 95, and a selection transistor 96.

The photodiode 91 generates a charge according to the amount of light received, and accumulates charges. The photodiode 91 has an anode terminal grounded, and has a cathode terminal connected to the FD 93 via the transfer transistor 92.

A gate terminal of the transfer transistor 92 is connected to a line for supplying a transfer signal, out of the pixel drive lines 52 formed for the pixel 90. The transfer transistor 92, when turned on by the transfer signal, reads out the charge generated by the photodiode 91, and transfers the charge to the FD 93.

The FD 93 holds the charge read from the photodiode 91. A gate terminal of the reset transistor 94 is connected to a line for supplying a reset signal, out of the pixel drive lines 52 formed for the pixel 90. The reset transistor 94, when turned on by the reset signal, discharges charges accumulated in the FD 93, to a power source 97 of a potential VDD, and resets the potential of the FD 93.

A gate terminal of the amplifying transistor 95 is connected to the FD 93, and the amplifying transistor 95 outputs a pixel signal corresponding to the potential of the FD 93 by using the power source 97.

A gate terminal of the selection transistor 96 is connected to a line for supplying a selection signal, out of the pixel drive lines 52 formed for the pixel 90. The selection transistor 96, when turned on by the selection signal, supplies the pixel signal output from the amplifying transistor 95, to the column processor 55 in FIG. 1 via the vertical signal line 53. The FD 93 may be shared among a plurality of pixels 90.

(First Structure Example of CMOS Image Sensor)

Figure 3:
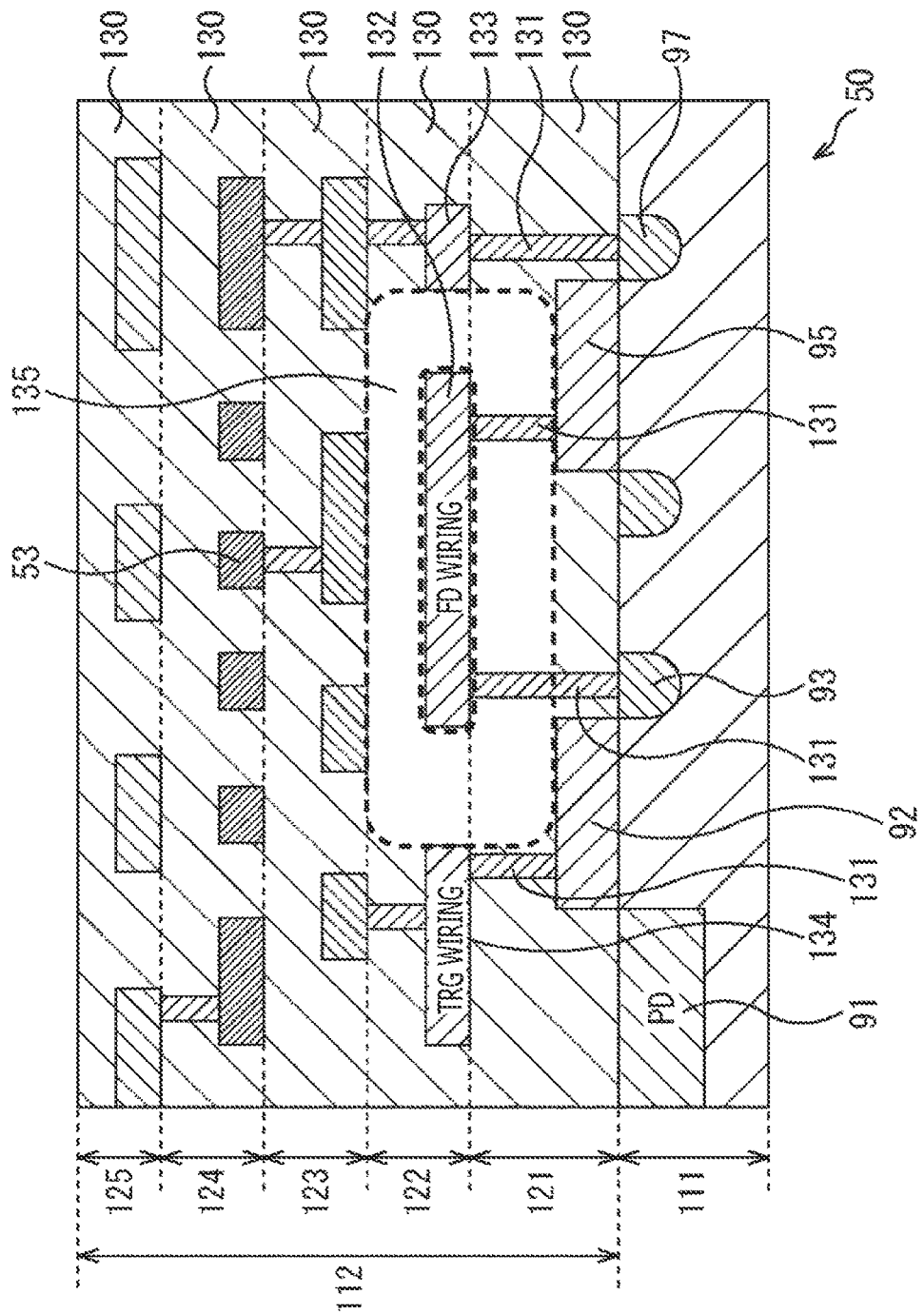
FIG. 3 is a diagram depicting a first structure example of a CMOS image sensor.

FIG. 3 is a diagram depicting a first structure example of the CMOS image sensor 50.

As depicted in FIG. 3, the CMOS image sensor 50 includes a wiring layer 112 stacked on a semiconductor substrate 111 such as a silicon substrate. The wiring layer 112 includes, for example, five wiring layers 121 to 125.

On the semiconductor substrate 111, the photodiode 91, the FD 93, the power source 97, and the like are formed. Between the photodiode 91 and the FD 93 on the semiconductor substrate 111, the transfer transistor 92 is formed. To the power source 97, the amplifying transistor 95 is connected. Further, in the wiring layer 124, the vertical signal lines 53 are formed.

The amplifying transistor 95 is connected to an FD wiring 132 formed in the wiring layer 122, through a via 131 formed in the wiring layer 121. Meanwhile, the FD 93 is connected to the FD wiring 132 through a via 131 formed in the wiring layer 121. With this arrangement, the amplifying transistor 95 and the FD 93 are connected through the vias 131 and the FD wiring 132.

The power source 97 is connected to a wiring 133 formed in the wiring layer 122, through a via 131 formed in the wiring layer 121. The transfer transistor 92 is connected to a TRG wiring 134 formed in the wiring layer 122, through a via 131 formed in the wiring layer 121.

In a region of the wiring layers 121 to 125 where a wiring is not formed, a wiring interlayer film 130 such as an SiO film is formed. However, in the example of FIG. 3, a region around the FD wiring 132 which region includes the entire region between the FD wiring 132 and the adjacent wiring 133 and between the FD wiring 132 and the adjacent TRG wiring 134, the wiring 133 and the TRG wiring 134 being formed in the wiring layer 122 other than the FD wiring 132, is a hollow region 135. The FD wiring 132 and the hollow region 135 are in contact with each other.

When the wiring interlayer film 130 is an SiO film, the dielectric constant of the hollow region (Air) 135 is ¼ times the dielectric constant of the wiring interlayer film 130. Therefore, by forming the hollow region 135, the capacitance of the FD wiring 132 is reduced to approximately ¼ of the capacitance of the FD wiring 132 in the case where the hollow region 135 is not formed.

Further, because the wiring interlayer film 130 is formed in the region other than the hollow region 135 in the wiring layer 122, mechanical strength is high, as compared with the case where the wiring interlayer film 130 is not formed in the entre wiring layer 122.

(Second Structure Example of CMOS Image Sensor)

Figure 4:
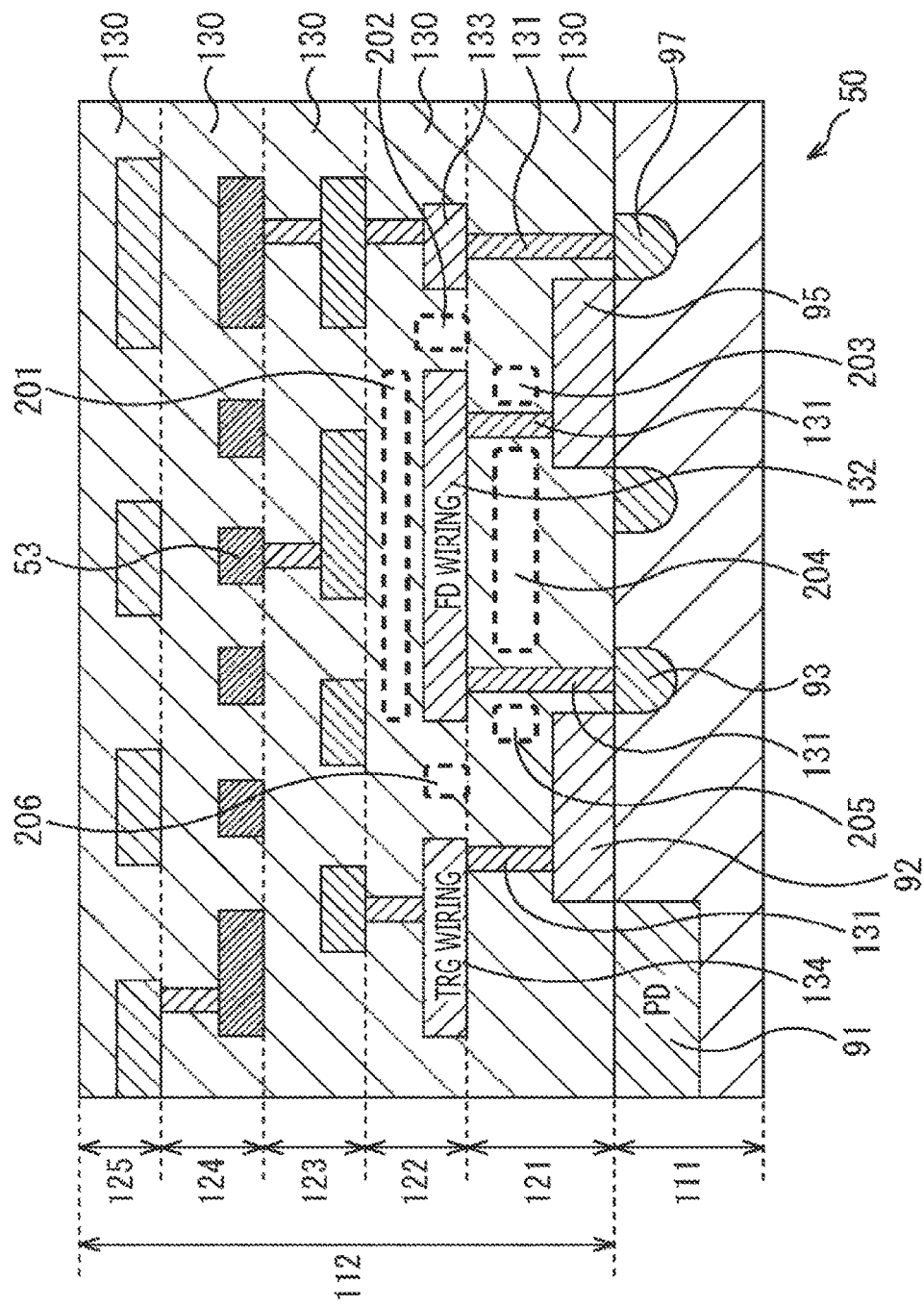
FIG. 4 is a diagram depicting a second structure example of a CMOS image sensor.

FIG. 4 is a diagram depicting a second structure example of the CMOS image sensor 50.

In the configuration depicted in FIG. 4, parts that are the same as those in FIG. 3 are attached with the same reference signs. Redundant description will be omitted as appropriate.

The structure of the CMOS image sensor 50 in FIG. 4 is different from the structure in FIG. 3 in that hollow regions 201 to 206 are formed instead of the hollow region 135.

In the example of FIG. 4, in the region around the FD wiring 132, including the entire region between the FD wiring 132 and the wiring 133 and between the FD wiring 132 and the TRG wiring 134, the hollow regions 201 to 206 are formed so as not to be in contact with the FD wiring 132, the wiring 133, and the TRG wiring 134.

Figure 5:
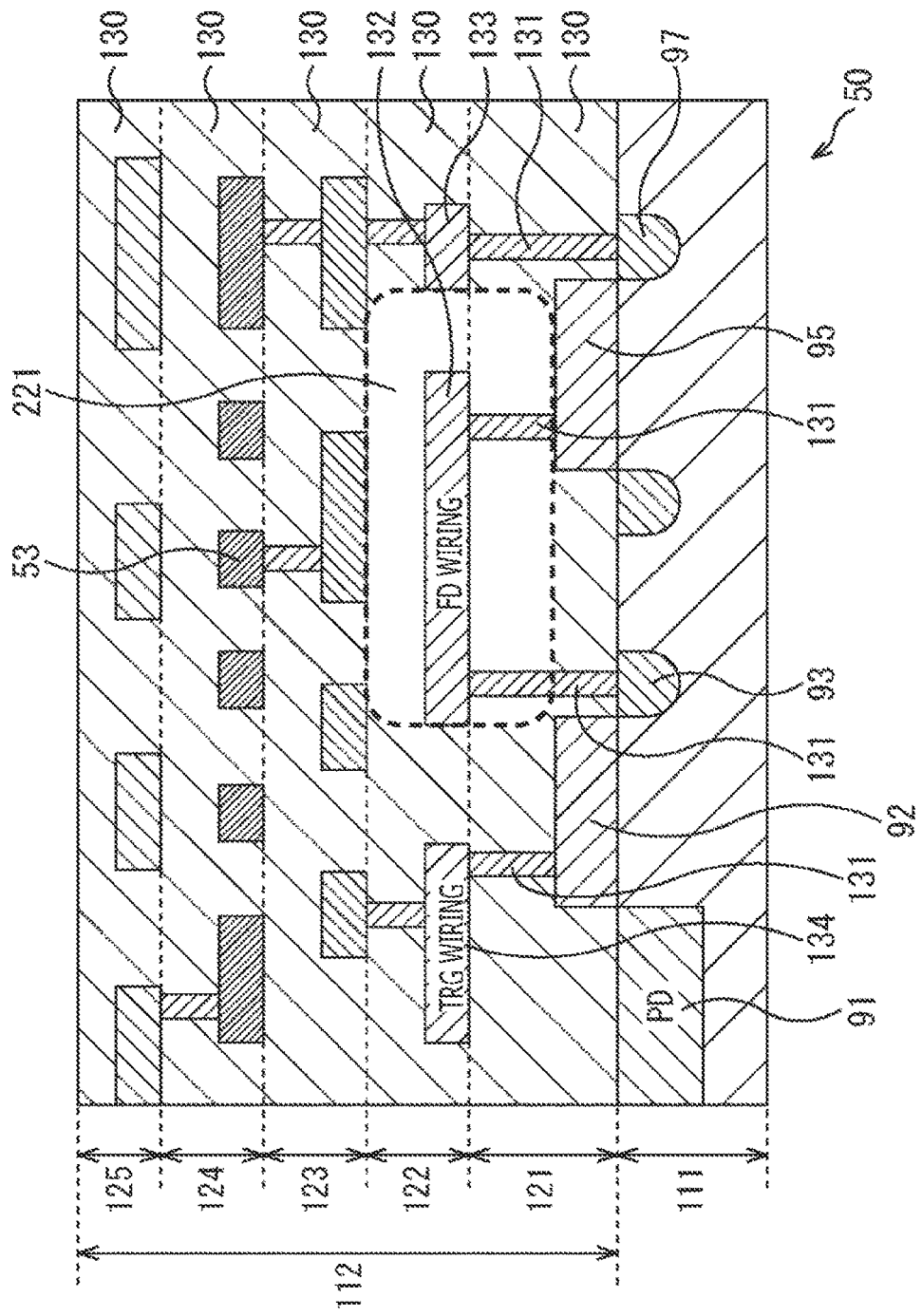
FIG. 5 is a diagram depicting a third structure example of a CMOS image sensor.

(Third structure example of CMOS image sensor) FIG. 5 is a diagram depicting a third structure example of the CMOS image sensor 50.

In the configuration depicted in FIG. 5, parts that are the same as those in FIG. 3 are attached with the same reference signs. Redundant description will be omitted as appropriate.

The structure of the CMOS image sensor 50 in FIG. 5 is different from the structure in FIG. 3 in that a hollow region 221 is formed instead of the hollow region 135.

In the example of FIG. 5, a region around the FD wiring 132, including only the region between the FD wiring 132 and the wiring 133, not including the entire region between the FD wiring 132 and the wiring 133 and between the FD wiring 132 and the TRG wiring 134, is the hollow region 221.

That is, because the FD wiring 132 handles analog signals, the FD wiring 132 has weak resistance to noise, as compared with wirings such as the vertical signal lines 53 that handle digital signals. Therefore, it is desirable to reduce the capacitance between the wiring 133 that becomes a noise source because of connection to the power source 97 and the FD wiring 132. However, in some cases, it is better to maintain the capacitance between the TRG wiring 134 and the FD wiring 132.

Therefore, in the example of FIG. 5, a region around the FD wiring 132, including only the region between the FD wiring 132 and the wiring 133, out of the region between the FD wiring 132 and the adjacent wiring 133 and the region between the FD wiring 132 and the adjacent TRG wiring 134, is set as the hollow region 221. That is, out of the region between the FD wiring 132 and the adjacent wiring 133 and the region between the FD wiring 132 and the adjacent TRG wiring 134, the region other than the region between the FD wiring 132 and the TRG wiring 134 becomes the hollow region 221.

As a result, noise propagation through the capacitance between the FD wiring 132 and the wiring 133 that becomes a noise source can be suppressed. Further, the capacitance between the TRG wiring 134 and the FD wiring 132 can be maintained.

The hollow region 221 may be in contact with the FD wiring 132 and the wiring 133 as depicted in FIG. 5, or may not be in contact with the FD wiring 132 and the wiring 133.

(Fourth Structure Example of CMOS Image Sensor)

Figure 6:
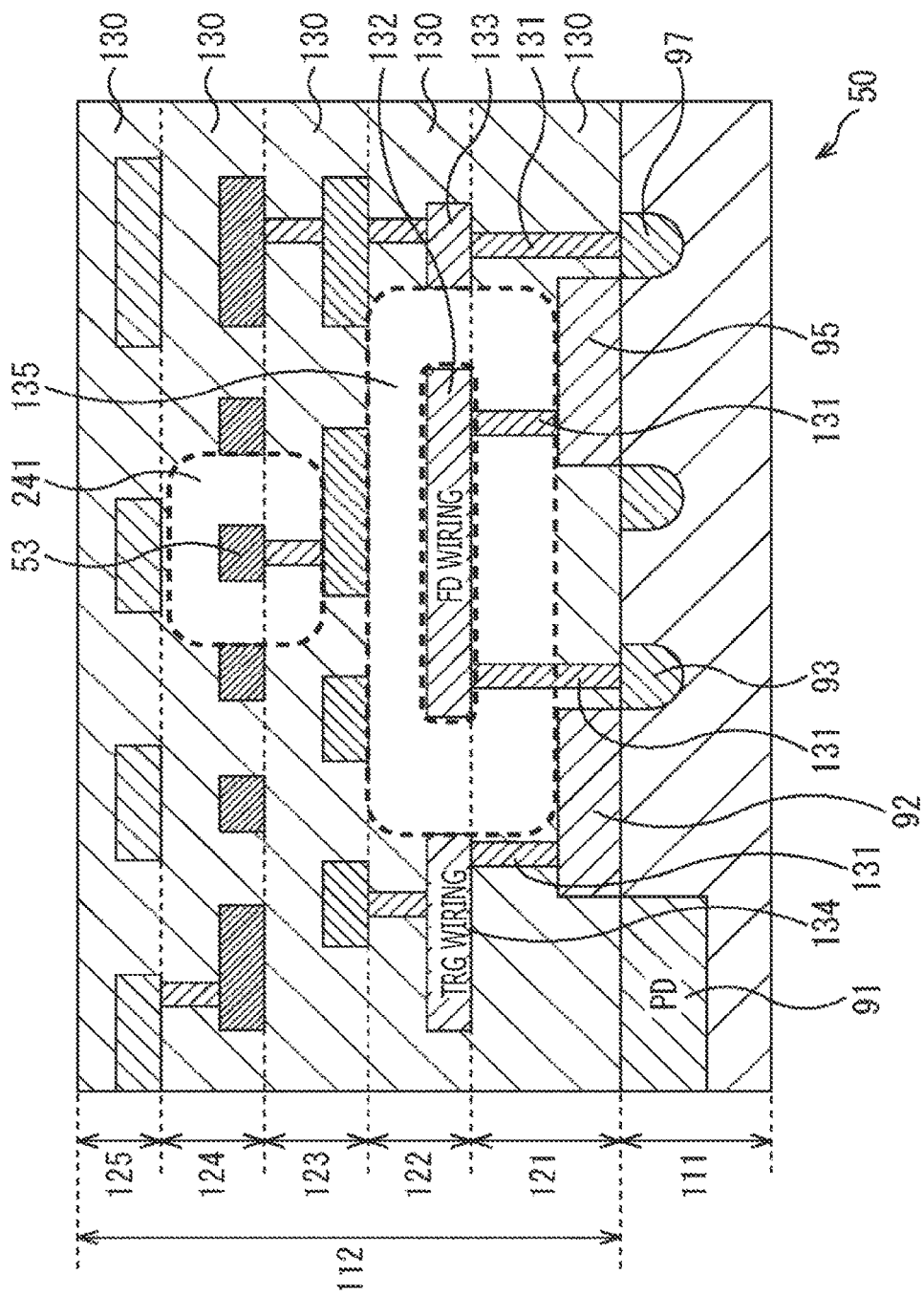
FIG. 6 is a diagram depicting a fourth structure example of a CMOS image sensor.

FIG. 6 is a diagram depicting a fourth structure example of the CMOS image sensor 50.

In the configuration depicted in FIG. 6, parts that are the same as those in FIG. 3 are attached with the same reference signs. Redundant description will be omitted as appropriate.

The structure of the CMOS image sensor 50 in FIG. 6 is different from the structure in FIG. 3 in that a hollow region 241 is formed in addition to the hollow region 135.

In the example of FIG. 6, the entire region around the vertical signal lines 53 is the hollow region 241.

That is, when the number of vertical signal lines 53 is large, high-speed drive can be performed, but the wiring density is increased and the capacitances of the vertical signal lines 53 increase. As a result, response is degraded, variation in pixel signals increases, and the image quality of the captured image is degraded. Therefore, in the example of FIG. 6, the entire region around the vertical signal lines 53 is made the hollow region 241. With this arrangement, the capacitances of the vertical signal lines 53 can be reduced. As a result, the image quality of the captured image can be improved by suppressing the variation in pixel signals during high-speed drive.

In the example of FIG. 6, while the entire region around the vertical signal lines 53 is the hollow region 241, only a part of the region around the vertical signal lines 53 may be the hollow region 241. Further, instead of the hollow region 135, the hollow regions 201 to 206 or the hollow region 221 may be formed.

Further, the hollow region 241 may be in contact with or may not be in contact with the wiring adjacent to the vertical signal lines 53, as depicted in FIG. 6.

As described above, in the CMOS image sensor 50, at least a part of the region between the FD wiring 132 and the wiring 133 and between the FD wiring 132 and the TRG wiring 134 is the hollow region 135 (201 to 206, or 221). Therefore, the capacitance of the FD wiring 132 can be reduced, and the charge-voltage conversion efficiency can be improved, without the need for changing the wiring layout.

Further, because the wiring layout does not need changing, any system can be employed as a system of sharing the pixels of the CMOS image sensor 50.

In the region of the wiring layers 121 to 125, other than the wirings and the hollow region 135 (201 to 206, 221, and/or 241), a low dielectric constant film may be formed instead of the wiring interlayer film 130.

Second Embodiment (Example of Circuit Configuration of Pixel of CMOS Image Sensor According to Second Embodiment)

A configuration of a CMOS image sensor as a solid-state image-capturing element according to a second embodiment of the present disclosure is the same as the configuration of the CMOS image sensor depicted in FIG. 1, except a circuit configuration of each of pixels arranged two-dimensionally in the pixel region 51 and the operation of the sweep scanning system. Therefore, in the following, there will be only described the circuit configuration of each pixel and the operation of the sweep scanning system. Configuration elements other than the pixels of the CMOS image sensor will be described by using the reference signs in FIG. 1.

Figure 7:
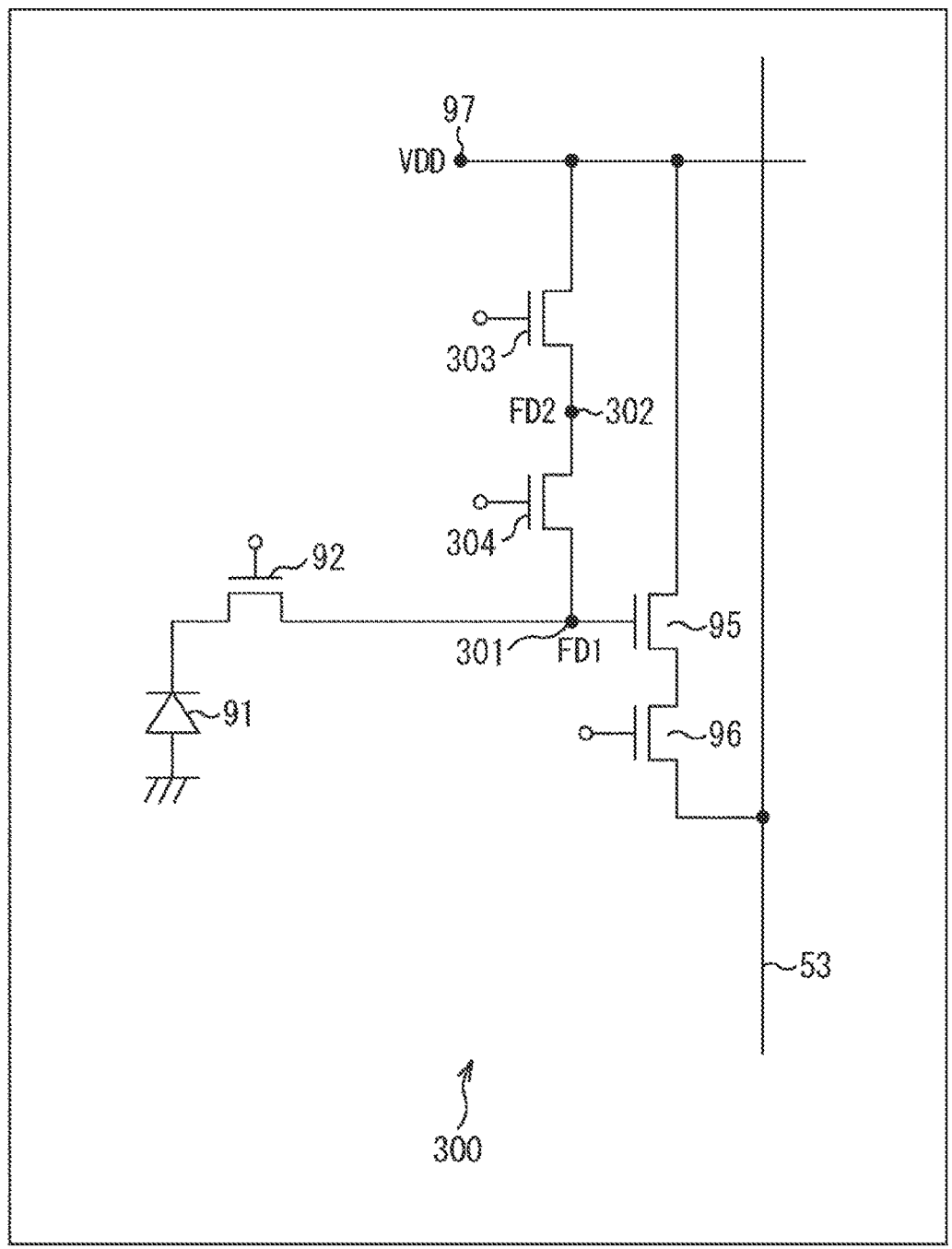
FIG. 7 is a diagram depicting an example of a circuit configuration of a pixel of a CMOS image sensor according to a second embodiment of the present disclosure.

FIG. 7 is a diagram depicting an example of the circuit configuration of the pixel of the CMOS image sensor according to the second embodiment of the present disclosure.

In the configuration depicted in FIG. 7, parts that are the same as those in FIG. 2 are attached with the same reference signs. Redundant description will be omitted as appropriate.

The circuit configuration of a pixel 300 in FIG. 7 is different from the circuit configuration of the pixel 90 in FIG. 2 in that FDs 301 and 302 are provided instead of the FD 93, and that reset transistors 303 and 304 are provided instead of the reset transistor 94. By switching between on and off of the reset transistor 304 of the pixel 300, the imaging mode can be switched between a high-charge-voltage conversion efficiency mode and a low-charge-voltage conversion efficiency mode.

Specifically, in the pixel 300, the gate terminal of the amplifying transistor 95 is connected to the FD 301. Between the power source 97 and the FD 301, the reset transistor 303 and the reset transistor 304 are connected in series via the FD 302.

To a gate terminal of the reset transistor 303 and to a gate terminal of the reset transistor 304, different lines out of the pixel drive lines 52 in the corresponding rows are connected. Different reset signals are supplied to these gate terminals via the different lines. The reset signal to be supplied to the reset transistor 303 is turned on by a sweep scanning system of the vertical drive unit 54, so as to sweep unnecessary charges from the photodiode 91.

The reset signal to be supplied to the reset transistor 304 is always maintained in the on state by the sweep scanning system, when the image-capturing mode is the low-charge-voltage conversion efficiency mode. Therefore, in this case, when the reset signal supplied to the reset transistor 303 is turned on, the potential of the FD 301 becomes a potential VDD of the power source 97, and the capacitance of the FD of the pixel 300 becomes only the capacitance of the FD 301. Consequently, the charge-voltage conversion efficiency becomes high.

On the other hand, when the image-capturing mode is the low-charge-voltage conversion efficiency mode, the reset signal to be supplied to the reset transistor 304 is always maintained in the off state by the sweep scanning system. Therefore, in this case, when the reset signal to be supplied to the reset transistor 303 is turned on, the potential of the FD 302 becomes the potential VDD of the power source 97, and the capacitance of the FD of the pixel 300 becomes a sum of the capacitances of the FD 301 and the FD 302. Consequently, the charge-voltage conversion efficiency becomes low.

In the pixel 300 configured as described above, the ratio of the charge-voltage conversion efficiency in the high-charge-voltage conversion efficiency mode to the charge-voltage conversion efficiency in the low-charge-voltage conversion efficiency mode (hereinafter, referred to as a mode ratio) is determined based on the ratio of the capacitance of the FD 301 to the sum of the capacitances of the FD 301 and the FD 302. The capacitance of the FD 301 and the capacitance of the FD 302 respectively contribute to the capacitance of an FD wiring not depicted connected to the FD 301 and the capacitance of an FD wiring not depicted connected to the FD 302.

Therefore, in the pixel 300, in order to obtain a desired mode ratio, a hollow region similar to the hollow region 135 (201 to 206 or 221) is formed around the FD wiring connected to the FD 301, for example, out of the two FD wirings connected individually to the FD 301 and the FD 302.

That is, as described above, by forming a hollow region around the FD wiring, the capacitance of the FD wiring can be reduced as compared with the case where the hollow region is not formed. Therefore, a hollow region is formed so that the capacitance of the FD wiring connected to the FD 301 becomes the capacitance of the FD wiring corresponding to the capacitance of the FD 301 which is determined based on the capacitance of the FD 302 and the desired mode ratio.

The hollow region may be formed only around the FD wiring connected to the FD 302, or may be formed around the two FD wirings connected to the FD 301 and the FD 302. Further, the FD 301 and the FD 302 may be shared among a plurality of pixels 300.

As described above, in the CMOS image sensor according to the second embodiment, two FDs of the FD 301 and the FD 302 are formed. An FD wiring is connected to the FD 301 and the FD 302. A hollow region is formed around at least one of the FD wirings. With this arrangement, the capacitance of the FD wiring around which the hollow region is formed is reduced as compared with the capacitance of the FD wiring around which the hollow region is not formed. As a result, the mode ratio can be set to a desired ratio.

On the other hand, when the hollow region is not formed around the FD wiring connected to the FD 301 and the FD 302, the mode ratio needs to be adjusted by the wiring layout. However, when the pixel 300 is small, the degree of freedom of wiring layout is low. Further, there is a limit to the wiring layout based on the sharing system of the pixel 300. Therefore, adjusting the mode ratio by the wiring layout is difficult.

Third Embodiment (Layout Example of Parts of CMOS Image Sensor)
A configuration of a CMOS image sensor as a solid-state image-capturing element according to a third embodiment of the present disclosure is the same as the configuration of the CMOS image sensor 50 depicted in FIG. 1. Therefore, description of the configuration is omitted. Further, in the subsequent drawings, parts that are the same as those of the CMOS image sensor 50 are attached with the same reference signs. Redundant description will be omitted as appropriate.

Figure 8:
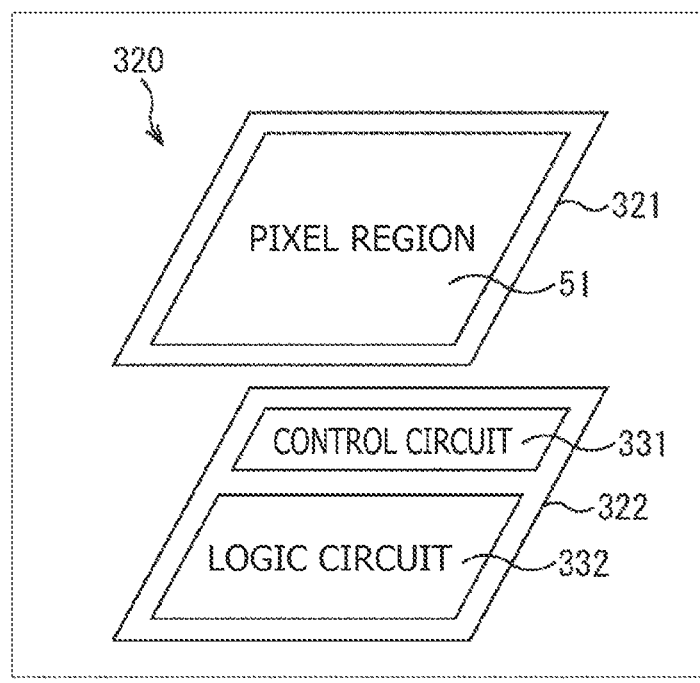
FIG. 8 is a view depicting an example of layout of parts of a CMOS image sensor according to a third embodiment.

FIG. 8 is a view depicting a layout example of parts of a CMOS image sensor according to the third embodiment.

According to a CMOS image sensor 320 in FIG. 8, a semiconductor substrate 321 is stacked on a semiconductor substrate 322. A pixel region 51 is disposed on the semiconductor substrate 321, and a control circuit 331 and a logic circuit 332 are disposed on the semiconductor substrate 322. One or more wiring layers are stacked on each of the semiconductor substrates 321 and 322. The semiconductor substrate 321 is stacked on the semiconductor substrate 322 such that the wiring layers are bonded together.

The control circuit 331 is a circuit including the vertical drive unit 54, the column processor 55, the horizontal drive unit 56, and the system controller 57, for example. The logic circuit 332 is a circuit including the signal processor 58 and the memory unit 59, for example.

In this case, the number of layers of the semiconductor substrates of the CMOS image sensor 320 is two, but may be one or three or more. Further, the control circuit 331 may be formed on the semiconductor substrate 321 on which the pixel region 51 is disposed.

Figure 9:
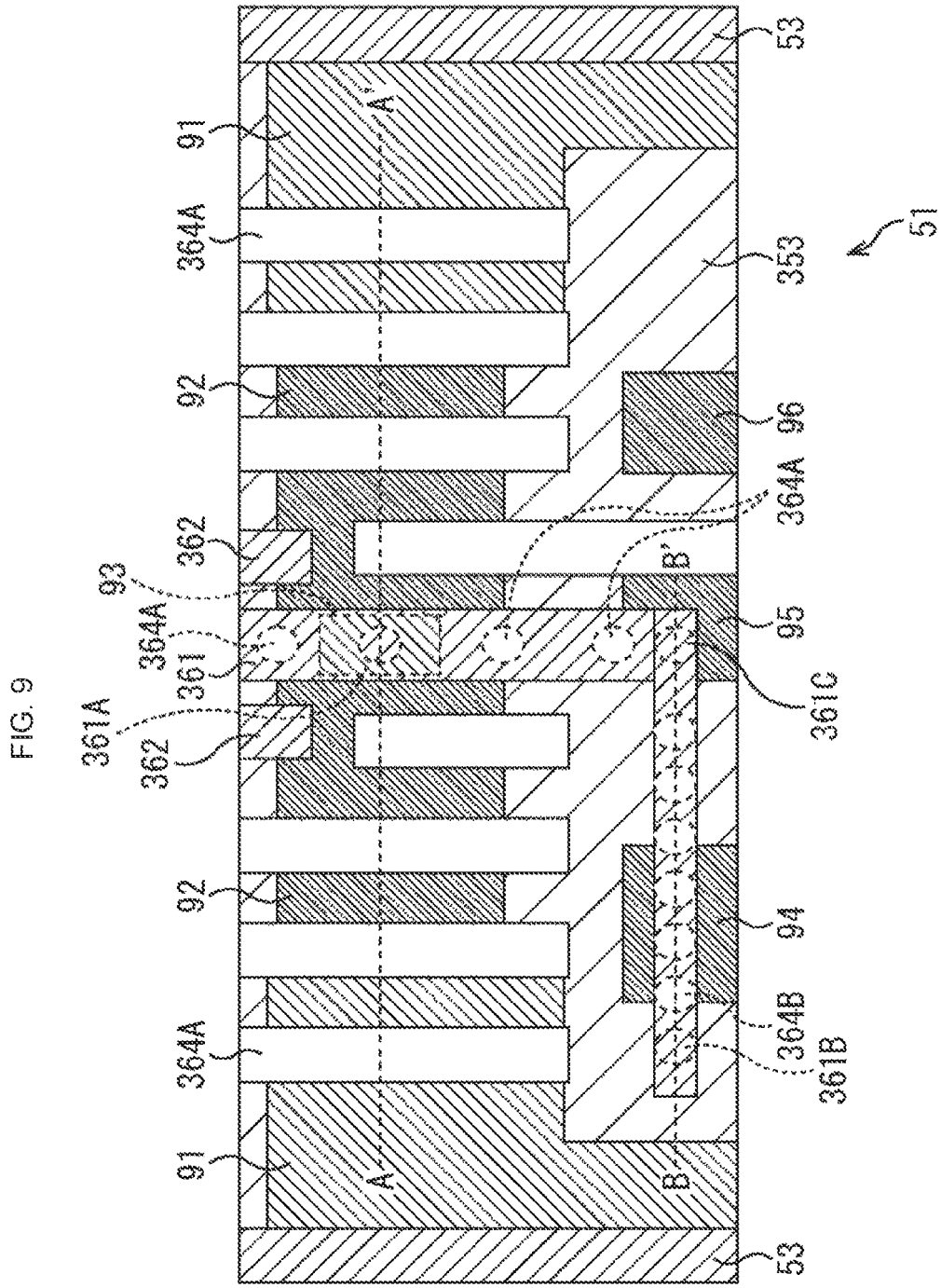
FIG. 9 is a plan view, looked at from a wiring layer side, of a first structure example of a pixel region in FIG. 8.
Figure 10:
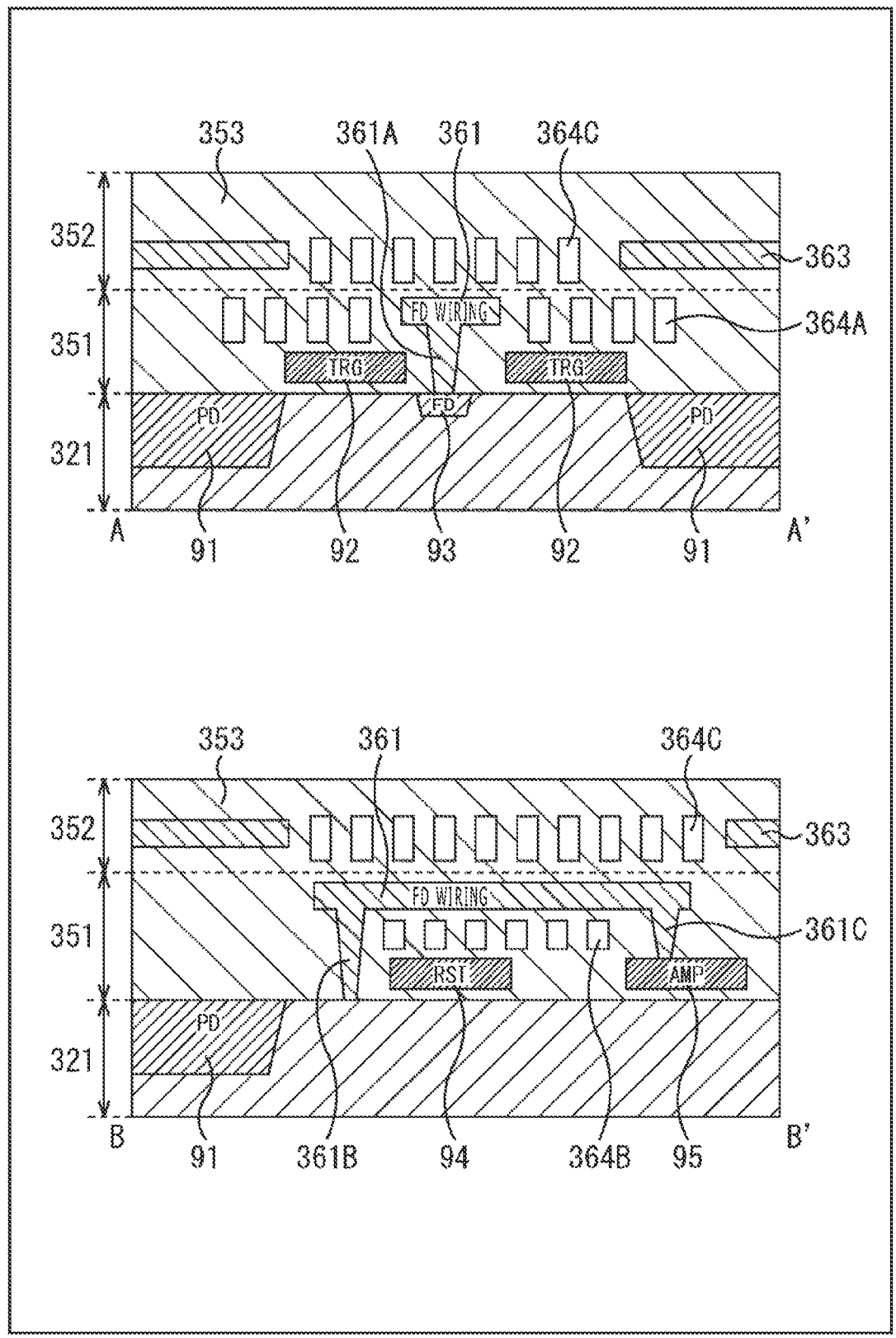
FIG. 10 includes a sectional view cut along A-A' in FIG. 9, and a sectional view cut along B-B' in FIG. 9.

(First Structure Example of Semiconductor Substrate 321)
FIG. 9 is a plan view, looked at from the wiring layer side, of a first structure example of the pixel region 51 of the semiconductor substrate 321 in FIG. 8. FIG. 10 includes a sectional view cut along A-A' and a sectional view cut along B-B' in FIG. 9. For convenience of description, FIG. 9 depicts the semiconductor substrate 321 and only one lowest wiring layer, and FIG. 10 depicts the semiconductor substrate 321 and only two lowest wiring layers.

As depicted in FIGS. 9 and 10, in the CMOS image sensor 320, the FD 93 is shared by two pixels 90 adjacent in the horizontal direction. As depicted in FIG. 10, in a lowest wiring layer 351 of the pixel region 51, there is formed the FD wiring 361 for connecting between the FD 93, a source of the reset transistor 94, and the gate of the amplifying transistor 95.

As depicted in FIG. 10, the FD wiring 361 is connected to the FD 93 through a via 361A, is connected to the source of the reset transistor 94 formed on the semiconductor substrate 321 through a via 361B, and is connected to the gate of the amplifying transistor 95 through a via 361C.

Further, as depicted in FIG. 9, to the gate of the transfer transistor 92, there is connected a TRG wiring 362 which is one wiring configuring the pixel drive lines 52. Further, as depicted in FIG. 10, various wirings 363 are formed in a wiring layer 352 on the wiring layer 351.

As depicted in FIGS. 9 and 10, in the wiring layer 351, between the FD wiring 361 and other wiring not depicted, a plurality of (four in the example in FIG. 10) hollow regions (air gaps) 364A are formed. Further, between the FD wiring 361 and the semiconductor substrate 321 that have different potentials, a plurality of (six in the example in FIG. 10) hollow regions 364B are formed. Further, in the region above the FD wiring 361 of the wiring layer 352, a plurality of hollow regions 364C are formed. As described above, the hollow regions 364A to 364C are formed between the FD wiring 361 and other wiring or electrodes of the semiconductor substrate 321. With this arrangement, the dielectric constant between the FD wiring 361 and other wiring or electrodes is reduced, and the capacitance of the FD wiring 361 is reduced. As a result, the charge-voltage conversion efficiency is improved.

Further, the hollow region formed between the FD wiring 361 and other wiring is configured by not one hollow region but is configured by a plurality of hollow regions 364A. Therefore, even when the distance between the FD wiring 361 and other wiring is increased to reduce the capacitance of the FD wiring 361, the size of one hollow region can be made small. As a result, the hollow region can be easily formed.

In the wiring layer 351 and the wiring layer 352, an insulating film 353 (a wiring interlayer film) such as an SiO film is formed, in the regions in which wirings such as the FD wiring 361, the TRG wiring 362, and the wiring 363, the hollow regions 364A to 364C, and transistors such as the transfer transistor 92 are not formed. In the third embodiment, the material of the insulating film 353 is SiO2, but is not limited to this material.

As described above, there is the insulating film 353 between the hollow regions 364A to 364C. Because the hollow regions 364A to 364C are supported by the insulating film 353, the capacitance of the FD wiring 361 can be reduced as compared with the case where the hollow regions 364A to 364C are supported by a conductor.

(Description of Method of Manufacturing First Structure Example of Semiconductor Substrate 321)

FIGS. 11 to 14 are diagrams depicting a method of manufacturing the semiconductor substrate 321 on which the wiring layer 351 and the wiring layer 352 in FIGS. 9 and 10 are stacked.

First, in a first process in FIG. 11, the photodiode 91, the FD 93, and transistors that configure the pixel 90, such as the transfer transistor 92, the reset transistor 94, and the amplifying transistor 95, are formed on the semiconductor substrate 321. Then, the insulating film 353 is formed on the semiconductor substrate 321.

In a second process in FIG. 11, a photoresist pattern is formed by coating a photoresist 381 in the regions other than the regions corresponding to the hollow regions 364B between the FD wiring 361 and the semiconductor substrate 321, on the insulating film 353. Then, the insulating film 353 is etched using the photoresist pattern. As a result, the insulating film 353 is removed from the regions where the photoresist 381 is not formed, that is, the regions corresponding to the hollow regions 364B. The sizes of the hollow regions 364B can be controlled by modifying the photoresist pattern.

In a third process in FIG. 12, the photoresist pattern is peeled off, and the insulating film 353 is formed by a film forming method of poor coverage. As a result, the hollow regions 364B between the FD wiring 361 and the semiconductor substrate 321 are formed. In a fourth process in FIG. 12, in the insulating film 353, the FD wiring 361 and the vias 361A to 361C are formed by a damascene method so that the FD 93 is connected to the source of the reset transistor 94 and the gate of the amplifying transistor 95.

In a fifth process in FIG. 13, a photoresist pattern is formed by coating the photoresist 381 in the regions other than the regions corresponding to the hollow regions 364A between the FD wiring 361 and other wiring not depicted in the wiring layer 351 in which the FD wiring 361 is formed, on the insulating film 353. Then, the insulating film 353 is etched using the photoresist pattern. As a result, the insulating film 353 is removed from the regions where the photoresist 381 is not formed, that is, the regions corresponding to the hollow regions 364A.

In a sixth process in FIG. 13, the photoresist pattern is peeled off, and the insulating film 353 is formed by a film forming method of poor coverage. As a result, the hollow regions 364A are formed. In a seventh process in FIG. 14, the wiring 363 of the wiring layer 352 is formed by a damascene method.

In an eighth process in FIG. 14, first, the hollow regions 364C above the FD wiring 361 are formed in a manner similar to that in the second process in FIG. 11, the third process in FIG. 12, and the fifth and sixth processes in FIG. 13.

Specifically, the photoresist pattern is formed by coating the photoresist 381 in the regions other than the regions corresponding to the hollow regions 364O above the FD wiring 361, on the insulating film 353. Then, the insulating film 353 is etched using the photoresist pattern. As a result, the insulating film 353 is removed from the regions corresponding to the hollow regions 364O. Thereafter, the photoresist pattern is peeled off, and the insulating film 353 is formed by a film forming method of poor coverage.

The thickness of the insulating film 353 to be etched in the second process in FIG. 11, the fifth process in FIG. 13, and the eighth process in FIG. 14 (the length in a direction perpendicular to the semiconductor substrate 321), that is, the thickness of each of the hollow regions 364A to 364O, is smaller than a few tenths of μm.

As described above, because the insulating film 353 above the hollow regions 364A to 364O is formed by a film forming method of poor coverage, the insulating film 353 can be formed above the hollow regions 364A to 364O while keeping the cavities of the hollow regions 364A to 364O. Quality of the insulating film 353 below the hollow regions 364A to 364C may be the same as, or may be different from, the quality of the insulating film 353 above the hollow regions 364A to 364O.

(Second Structure Example of Semiconductor Substrate 321)

Figure 15:
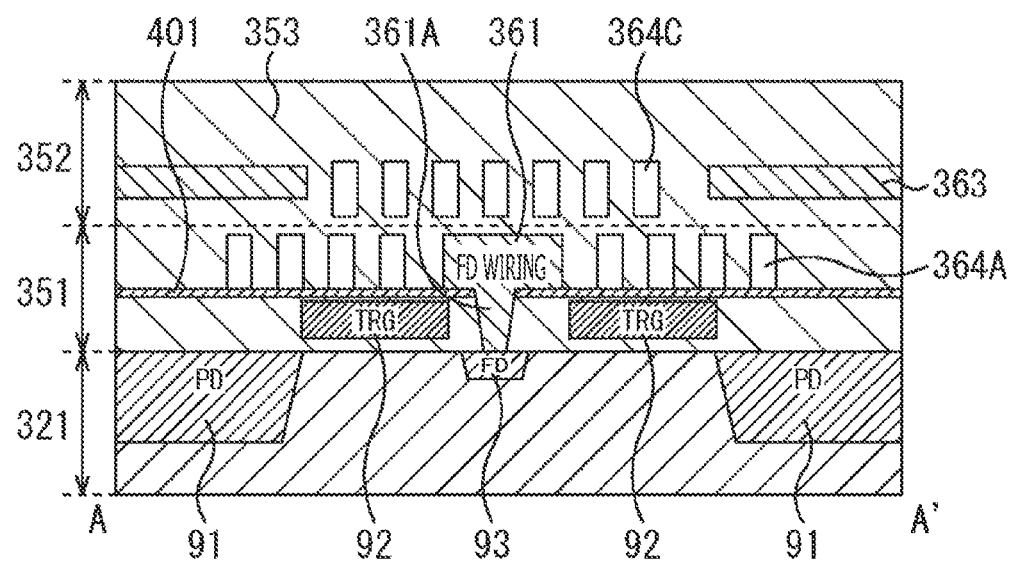
FIG. 15 is a sectional view of a second structure example of the pixel region in FIG. 8 cut along A-A' in FIG. 9.

FIG. 15 is a sectional view of a second structure example of the pixel region 51 of the semiconductor substrate 321 in FIG. 8 cut along A-A' in FIG. 9. For convenience of description, FIG. 15 depicts the semiconductor substrate 321 and only two lowest wiring layers.

In the configuration depicted in FIG. 15, parts that are the same as those in FIG. 10 are attached with the same reference signs. Redundant description will be omitted as appropriate.

The configuration of the semiconductor substrate 321 on which the wiring layer 351 and the wiring layer 352 are stacked in FIG. 15 is different from the configuration in FIG. 10 in that a stopper film 401 is formed so as to be in contact with the bottom surfaces of the FD wiring 361 and the hollow regions 364A.

The stopper film 401 is a film, such as an SiOC film, for stopping the etching of the insulating film 353 at the time of forming the FD wiring 361 by a damascene method.

(Description of Method of Manufacturing Second Structure Example of Semiconductor Substrate 321)

FIGS. 16 to 19 are diagrams depicting a method of manufacturing the semiconductor substrate 321 on which the wiring layer 351 and the wiring layer 352 in FIG. 15 are stacked.

First, the first to third processes in FIGS. 11 and 12 are performed, and the hollow regions 364B between the FD wiring 361 and the semiconductor substrate 321 are formed. Next, in first to sixth processes in FIGS. 16 to 18, the FD wiring 361 and the vias 361A to 361C are formed by a damascene method.

That is, in the first process in FIG. 16, the insulating film 353 is formed on the semiconductor substrate 321 on which the hollow regions 364B are formed. Then, the insulating film 353 is planarized.

In the second process in FIG. 16, the stopper film 401 is formed on the insulating film 353. In the third process in FIG. 17, on the stopper film 401, the insulating film 353 having a predetermined thickness is formed (is stacked).

In the fourth process in FIG. 17, the regions corresponding to the vias 361A to 361C of the insulating film 353 below the stopper film 401 are etched, and the regions corresponding to the FD wiring 361 of the insulating film 353 above the stopper film 401 are etched. Etching of the insulating film 353 above the stopper film 401 is stopped by the stopper film 401. That is, the bottom surface of the etched region of the insulating film 353 above the stopper film 401 is in contact with the upper surface of the stopper film 401.

In the fifth process in FIG. 18, a film of copper (Cu) 402 is formed on the insulating film 353 of the uppermost layer. In the sixth process in FIG. 18, the copper 402 which is unnecessary above the insulating film 353 is removed. As a result, the FD wiring 361 and the vias 361A to 361C are formed.

Figure 19:
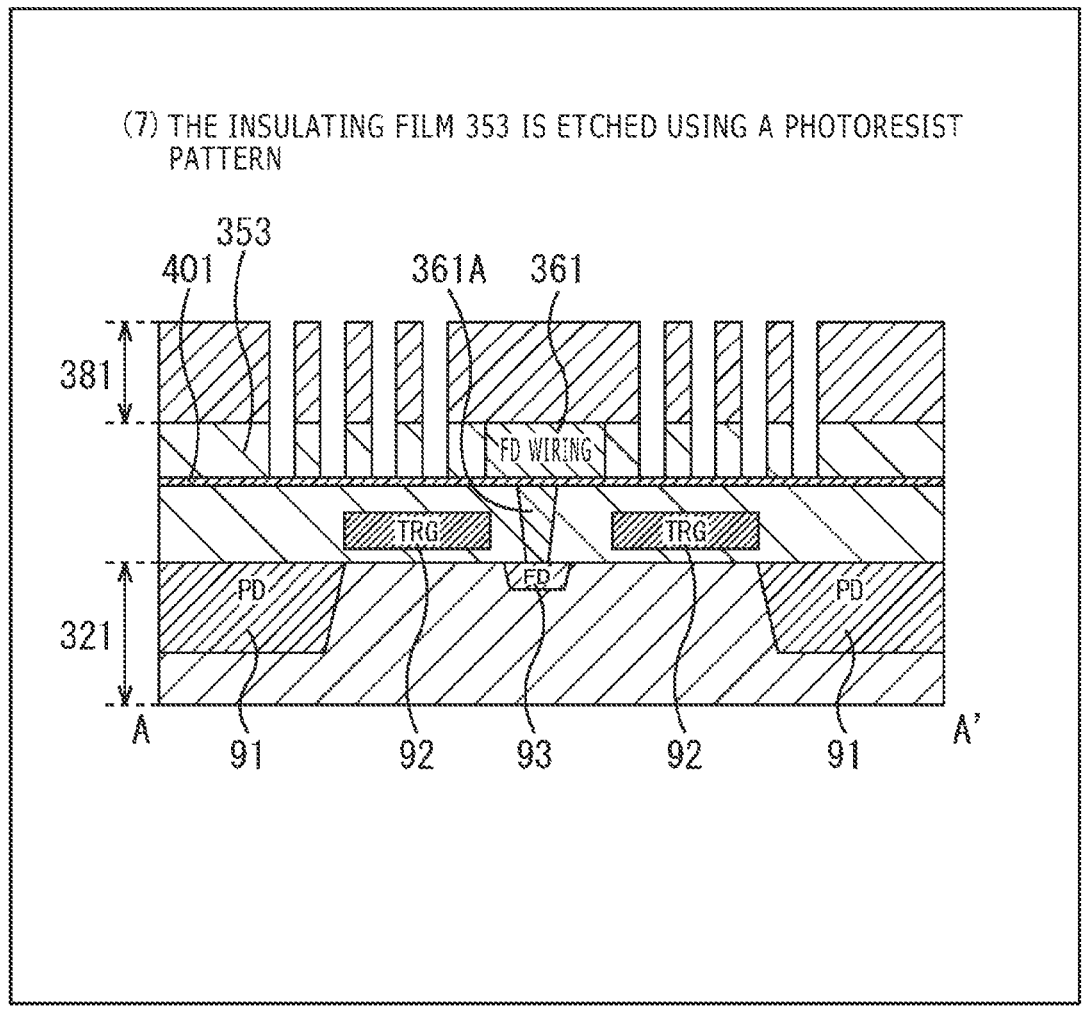
FIG. 19 is a diagram for describing the method of manufacturing the semiconductor substrate in FIG. 15.

Next, in a seventh process in FIG. 19, a photoresist pattern is formed by coating the photoresist 381 in the regions other than the regions corresponding to the hollow regions 364A between the FD wiring 361 and other wiring not depicted in the wiring layer 351 in which the FD wiring 361 is formed, on the insulating film 353. Then, the insulating film 353 is etched using the photoresist pattern so as to stop the etching by the stopper film 401. As a result, the insulating film 353 is removed from the regions where the photoresist 381 is not formed, that is, the regions corresponding to the hollow regions 364A.

Thereafter, the sixth to eighth processes in FIG. 13 and FIG. 14 are performed, and the hollow regions 364A and the hollow regions 364C are formed.

With the above arrangement, the bottom surfaces of all the hollow regions 364A are in contact with the upper surface of the stopper film 401. That is, the positions in the thickness direction of the bottom surfaces of all the hollow regions 364A are the same. Therefore, variations in the depths of the hollow regions 364A (the lengths in the direction perpendicular to the semiconductor substrate 321) are reduced. As a result, variations in the capacitance of the FD wiring 361 are reduced.

Figure 20:
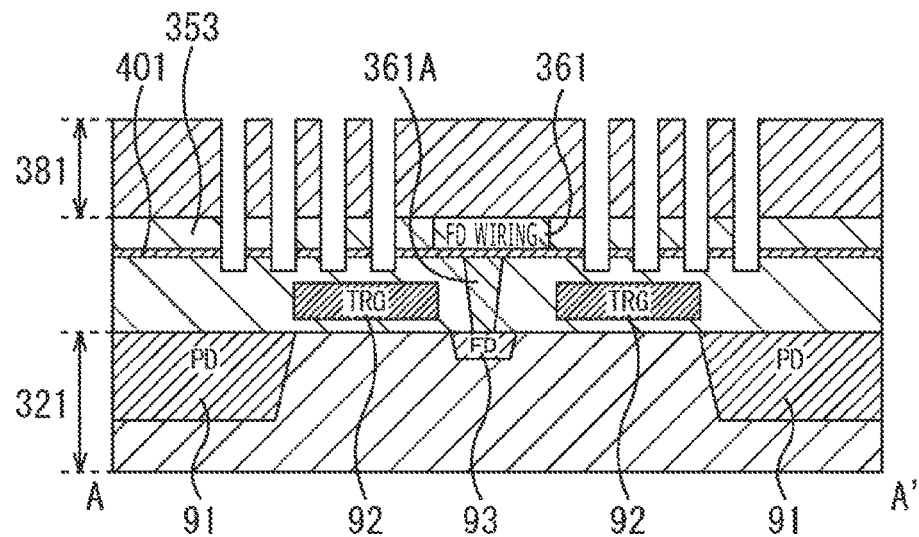
FIG. 20 is a sectional view of other second structure example of the pixel region in FIG. 8 cut along A-A' in FIG. 9.

In the seventh process in FIG. 19, after the etching of the insulating film 353 is stopped by the stopper film 401, etching may be further performed, as depicted in FIG. 20.

(Third Structure Example of Semiconductor Substrate 321)

Figure 21:
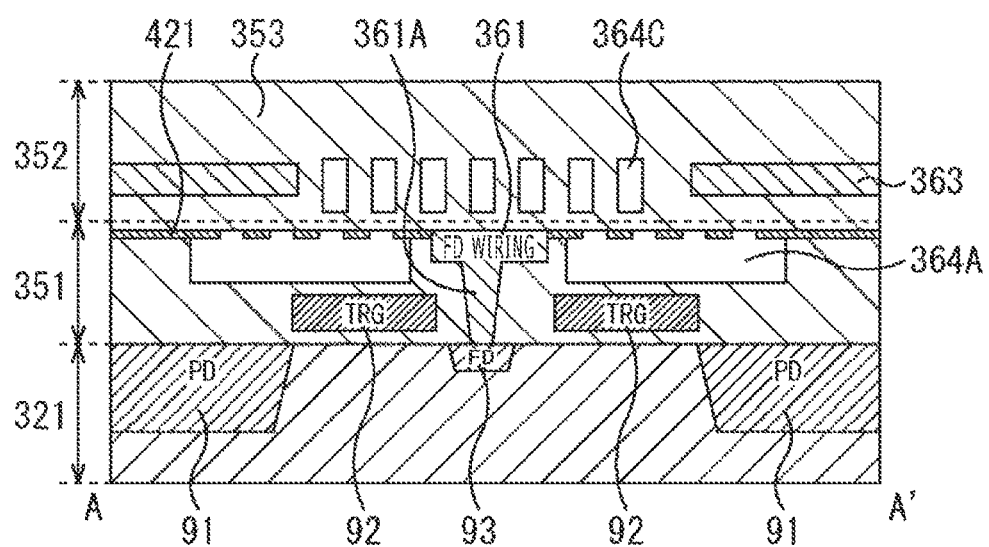
FIG. 21 is a sectional view of a third structure example of the pixel region in FIG. 8 cut along A-A' in FIG. 9.

FIG. 21 is a sectional view of a third structure example of the pixel region 51 of the semiconductor substrate 321 in FIG. 8 cut along A-A' in FIG. 9. For convenience of description, FIG. 21 depicts the semiconductor substrate 321 and only two lowest wiring layers.

In the configuration depicted in FIG. 21, parts that are the same as those in FIG. 10 are attached with the same reference signs. Redundant description will be omitted as appropriate.

The configuration of the semiconductor substrate 321 on which the wiring layer 351 and the wiring layer 352 are stacked in FIG. 21 is different from the configuration in FIG. 10 in that the lower parts of four continuous hollow regions 364A are connected together and that the insulating film around the upper parts of the hollow regions 364A is an insulating film 421 of which material is different from the material of the insulating film 353.

The material of the insulating film 421 is SiN, for example.

(Description of Method of Manufacturing Third Structure Example of Semiconductor Substrate 321)

FIGS. 22 and 23 are diagrams depicting a method of manufacturing the semiconductor substrate 321 on which the wiring layer 351 and the wiring layer 352 in FIG. 21 are stacked.

First, the first to third processes in FIGS. 11 and 12 are performed, and the hollow regions 364B between the FD wiring 361 and the semiconductor substrate 321 are formed. Next, in a first process in FIG. 22, the insulating film 421 is formed on the insulating film 353. Then, in the insulating film 353 and the insulating film 421, the FD wiring 361 and the vias 361A to 361C are formed so as to be in contact with the FD 93 by a damascene method.

Next, in a second process in FIG. 22, a photoresist pattern is formed by coating the photoresist 381 in the regions other than the regions corresponding to the hollow regions 364A, on the insulating film 421.

Then, the insulating film 353 and the insulating film 421 are etched using the photoresist pattern. As a result, the insulating film 353 and the insulating film 421 are removed in the regions where the photoresist 381 is not formed, that is, the regions corresponding to the hollow regions 364A.

In a third process in FIG. 23, isotropic etching of the insulating film 353 and the insulating film 421 is performed under the condition that the etching rate of the insulating film 353 becomes larger than the etching rate of the insulating film 421. As a result, only the insulating film 353 is etched, and the lower parts of the four hollow regions 364A are connected together.

In a fourth process in FIG. 23, the photoresist pattern is peeled off, and the insulating film 353 is formed by a film forming method of poor coverage. In this case, while the lower part of the hollow region 364A has a large size, the upper part has a small size. Therefore, the hollow region 364A closes before the material of the insulating film 353 reaches the lower part. As a result, the cavity of the hollow region 364A is maintained. Thereafter, the seventh and eighth processes in FIG. 14 are performed, and the hollow region 364C is formed.

Figure 24:
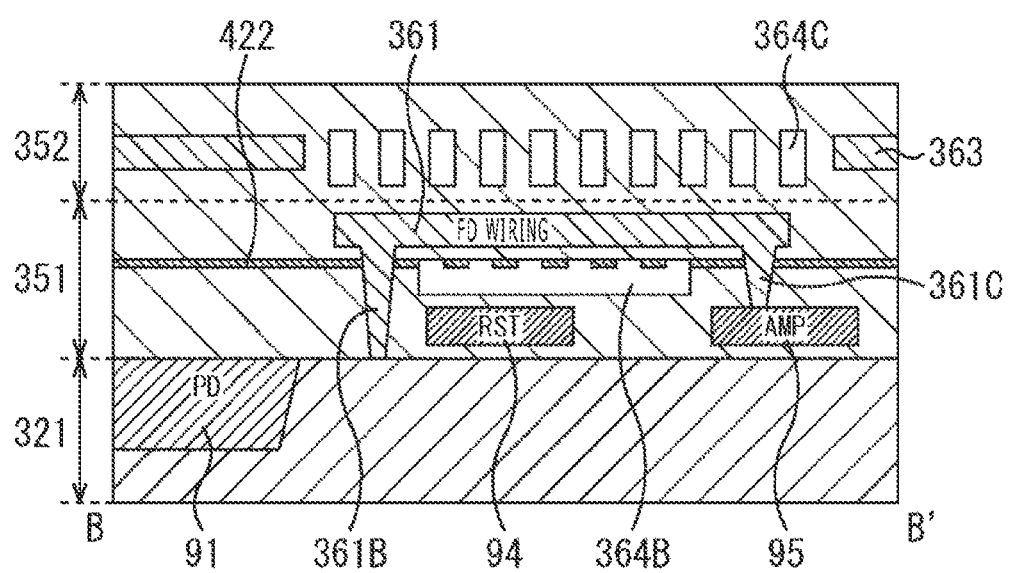
FIG. 24 is a diagram depicting other structure example of a hollow region between an FD wiring and a semiconductor substrate.

As depicted in FIG. 24, in a manner similar to that applied to the hollow regions 364A, the insulating film 422 may be formed around the upper part of the hollow regions 364B, and the lower parts of the hollow regions 364B may be connected together. Although not depicted, the lower parts of the hollow regions 364C may be connected together. Further, the size of the lower part of each of the hollow regions 364A to 364C may be larger than the size of the upper part of each of the hollow regions 364A to 364C, and the respective lower parts of the hollow regions 364A to 364C may not be connected together.

(First Method of Manufacturing CMOS Image Sensor)

Figure 26:
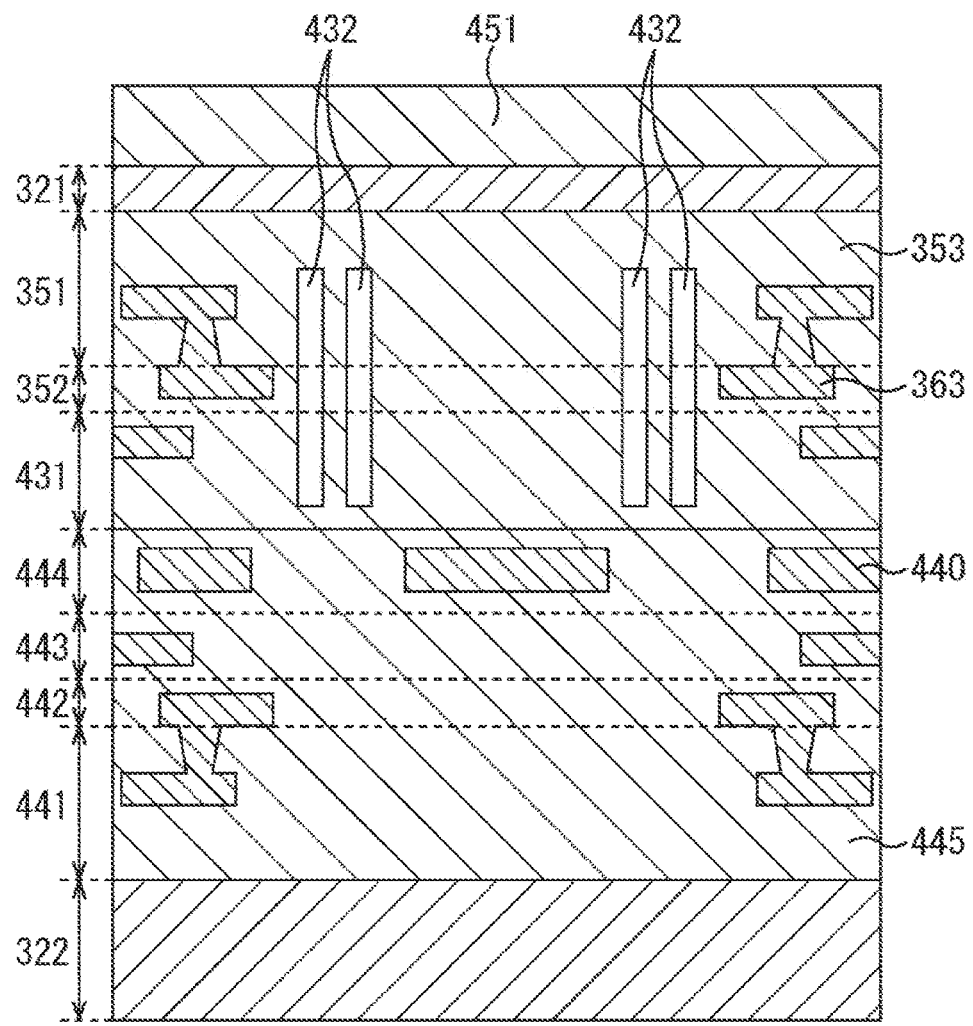
FIG. 26 is a diagram for describing the first method of manufacturing the CMOS image sensor in FIG. 8.
Figure 27:
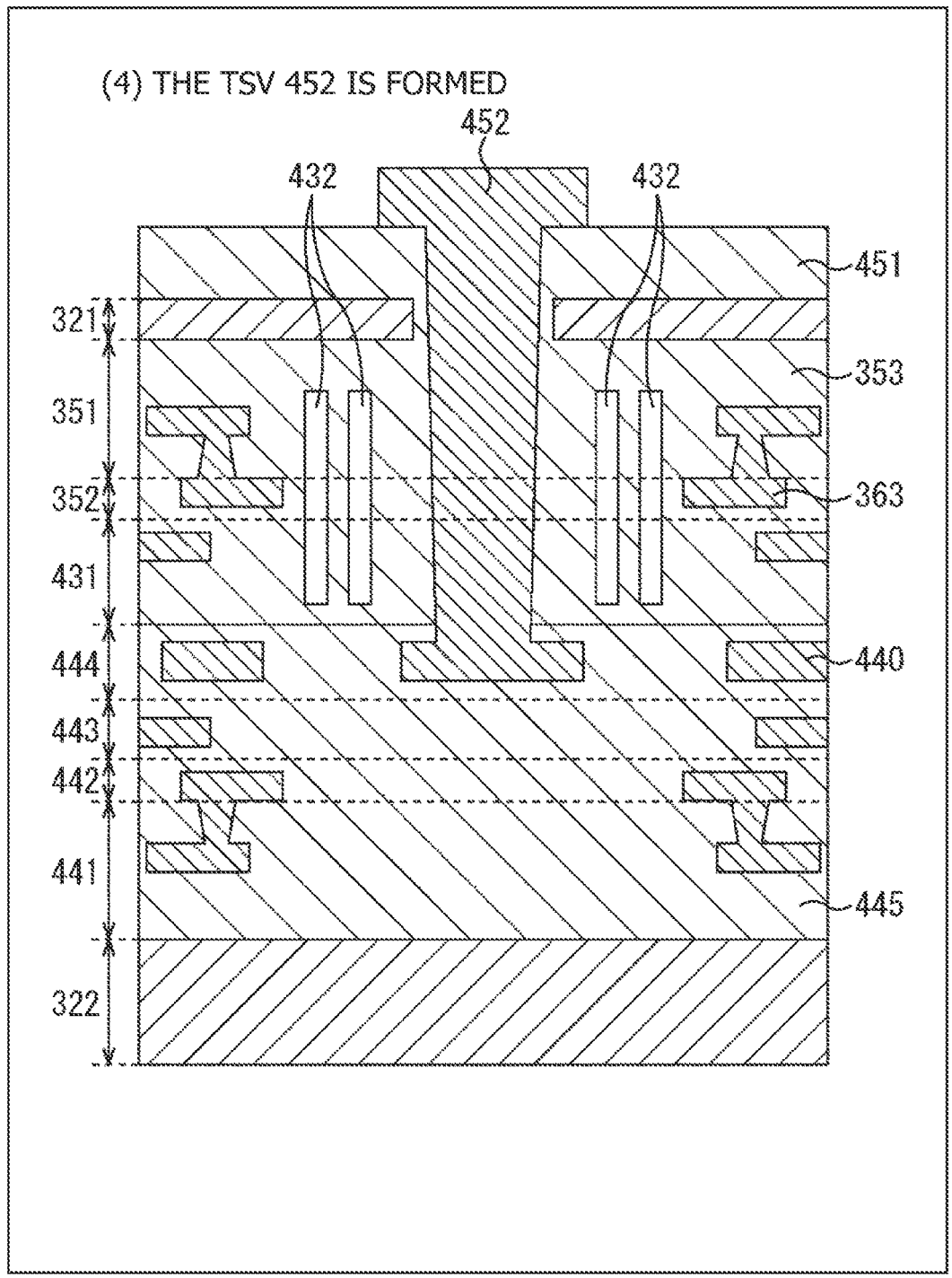
FIG. 27 is a diagram for describing the first method of manufacturing the CMOS image sensor in FIG. 8.
Figure 28:
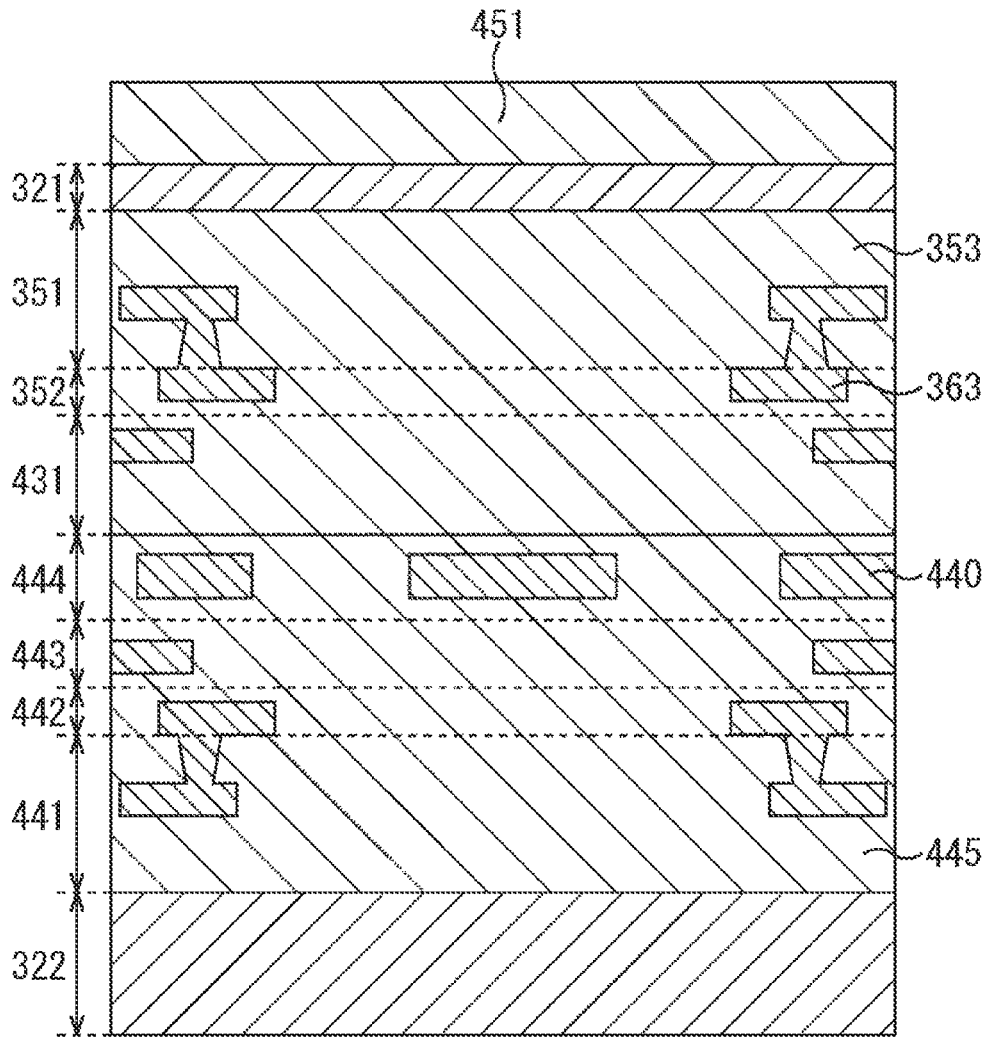
FIG. 28 is a diagram for describing a second method of manufacturing the CMOS image sensor in FIG. 8.

FIGS. 25 to 27 are diagrams for describing a first method of manufacturing the CMOS image sensor 320 depicted in FIG. 8. The CMOS image sensor 320 is manufactured by bonding the semiconductor substrate 321 to the semiconductor substrate 322 that are manufactured by the method in FIGS. 11 to 14.

After manufacturing the semiconductor substrate 321 on which the wiring layers 351 and 352 are stacked by the manufacturing method in FIGS. 11 to 14, a wiring layer 431 is further stacked on the semiconductor substrate 321. Then, in a first process in FIG. 25, a photoresist pattern is formed by coating the photoresist 381 in the region around the region in which a TSV 452 is to be formed in other than the pixel region 51, on the insulating film 353 of the wiring layer 352. Then, the insulating film 353 is etched using the photoresist pattern. With this arrangement, the insulating film 353 is removed from the regions where the photoresist 381 is not formed, that is, the regions around the region in which the TSV 452 is to be formed.

In a second process in FIG. 25, the photoresist pattern is peeled off, and the insulating film 353 is formed by a film forming method of poor coverage. As a result, hollow regions 432 are formed in the regions around the region in which the TSV 452 (connection section) is to be formed.

In a third process in FIG. 26, the semiconductor substrate 321 and the semiconductor substrate 322 are bonded together.

Specifically, in the example in FIG. 26, on the semiconductor substrate 322, four wiring layers 441 to 444 in which various wirings 440 are formed are stacked. An insulating film 445 is formed in the region in which the wirings 440 and the like are not formed in the wiring layers 441 to 444.

The wiring 440 of the uppermost wiring layer 444 is made of, for example, aluminum (Al). The wiring 440 of the wiring layers 441 to 443 other than the uppermost layer is formed by, for example, copper (Cu). The semiconductor substrate 321 and the semiconductor substrate 322 are bonded so that the uppermost wiring layer 431 of the semiconductor substrate 321 and the uppermost wiring layer 444 of the semiconductor substrate 322 are bonded together.

After the semiconductor substrate 321 and the semiconductor substrate 322 are bonded together, an insulating film 451 is formed on the surface facing the surface on which the wiring layer 351 of the semiconductor substrate 321 is stacked. Further, a color filter, an on-chip lens or the like not depicted is formed in the region corresponding to the pixel region 51 of the surface facing the surface on which the wiring layer 351 of the semiconductor substrate 321 is stacked. Further, the semiconductor substrate 321 and the semiconductor substrate 322 after the bonding are thinned. With this arrangement, the CMOS image sensor 320 is formed in the desired thickness.

Next, in a fourth process in FIG. 27, regions of the insulating film 451, the semiconductor substrate 321, the insulating film 353, and the insulating film 445 in which regions the TSV 452 is formed are etched, and the TSV 452 is formed. The TSV 452 is connected to the wiring 440 of the wiring layer 444 and the wiring 363 of the wiring layer 351, so that the semiconductor substrate 321 and the semiconductor substrate 322 are electrically connected to each other.

(Second Method of Manufacturing CMOS Image Sensor)
FIGS. 28 to 31 are diagrams for describing a second method of manufacturing the CMOS image sensor 320 in FIG. 8 which is manufactured by bonding the semiconductor substrate 321 and the semiconductor substrate 322 manufactured by the method in FIGS. 11 to 14.

After the semiconductor substrate 321 is manufactured on which the wiring layer 351 and the wiring layer 352 are stacked by the manufacturing method in FIGS. 11 to 14, the wiring layer 431 is further stacked. Then, in a first process in FIG. 28, the semiconductor substrate 321 and the semiconductor substrate 322 are bonded so that the uppermost wiring layer 352 of the semiconductor substrate 321 and the uppermost wiring layer 442 of the semiconductor substrate 322 are bonded together.

After the semiconductor substrate 321 and the semiconductor substrate 322 are bonded together, the insulating film 451 is formed on the surface facing the surface on which the wiring layer 351 of the semiconductor substrate 321 is stacked. Further, a color filter, an on-chip lens or the like not depicted is formed in the region corresponding to the pixel region 51 of the surface facing the surface on which the wiring layer 351 of the semiconductor substrate 321 is stacked. Further, the semiconductor substrate 321 and the semiconductor substrate 322 after the bonding are thinned. With this arrangement, the CMOS image sensor 320 is formed in the desired thickness.

Figure 29:
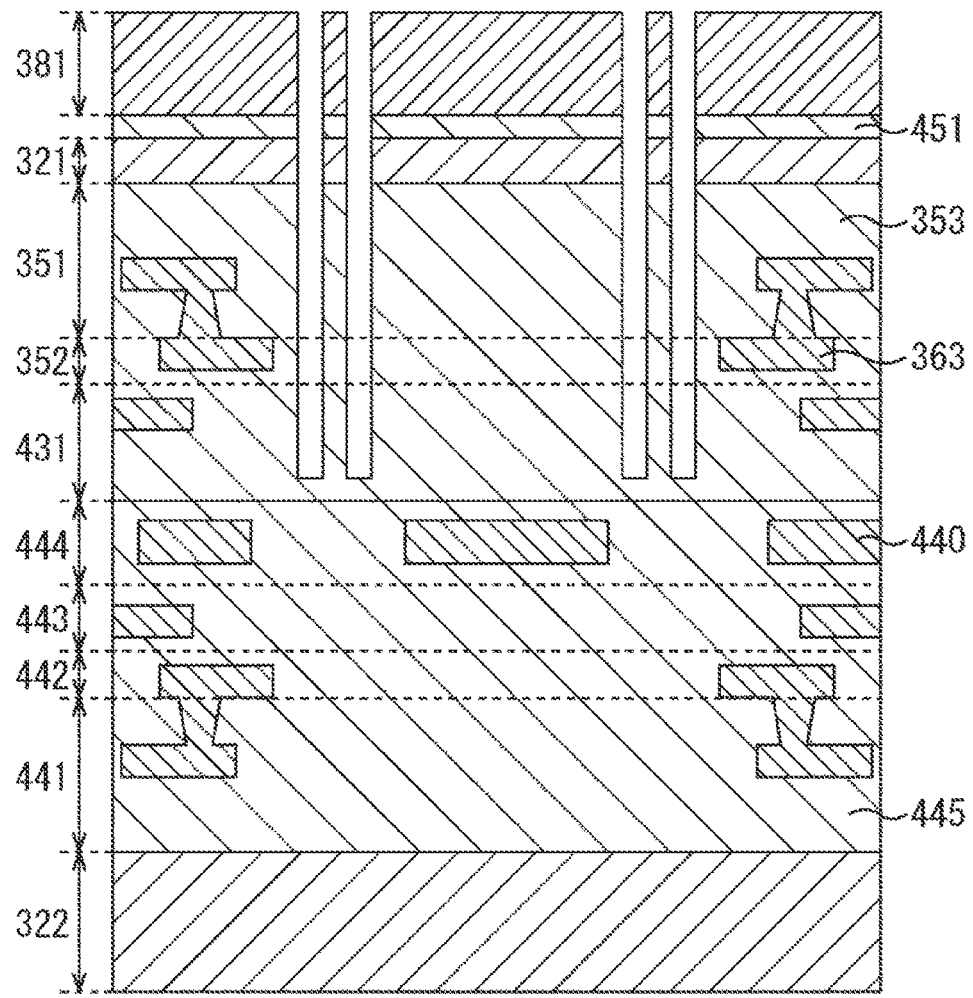
FIG. 29 is a diagram for describing the second method of manufacturing the CMOS image sensor in FIG. 8.

Then, in a second process in FIG. 29, a photoresist pattern is formed by coating the photoresist 381 in the regions around the region in which the TSV 452 is to be formed other than the pixel region 51, on the insulating film 451. Then, the semiconductor substrate 321, the insulating film 451, and the insulating film 353 are etched using the photoresist pattern. With this arrangement, the semiconductor substrate 321, the insulating film 451, and the insulating film 353 are removed from the regions where the photoresist 381 is not formed, that is, the regions around the region in which the TSV 452 is to be formed.

Figure 30:
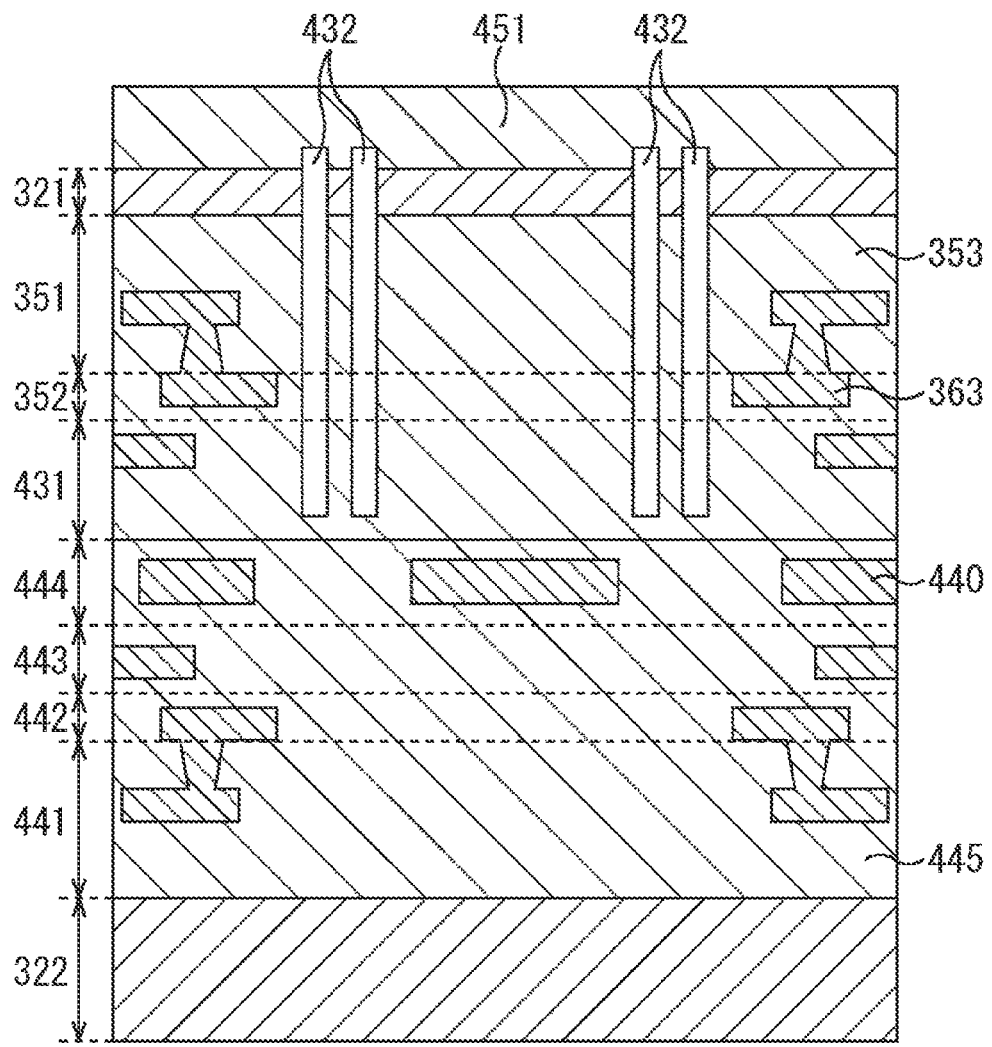
FIG. 30 is a diagram for describing the second method of manufacturing the CMOS image sensor in FIG. 8.

In a third process in FIG. 30, the photoresist pattern is peeled off, and the insulating film 451 is formed by a film forming method of poor coverage. As a result, the hollow regions 432 piercing through the semiconductor substrate 321 are formed in the regions around the region in which the TSV 452 is to be formed.

Figure 31:
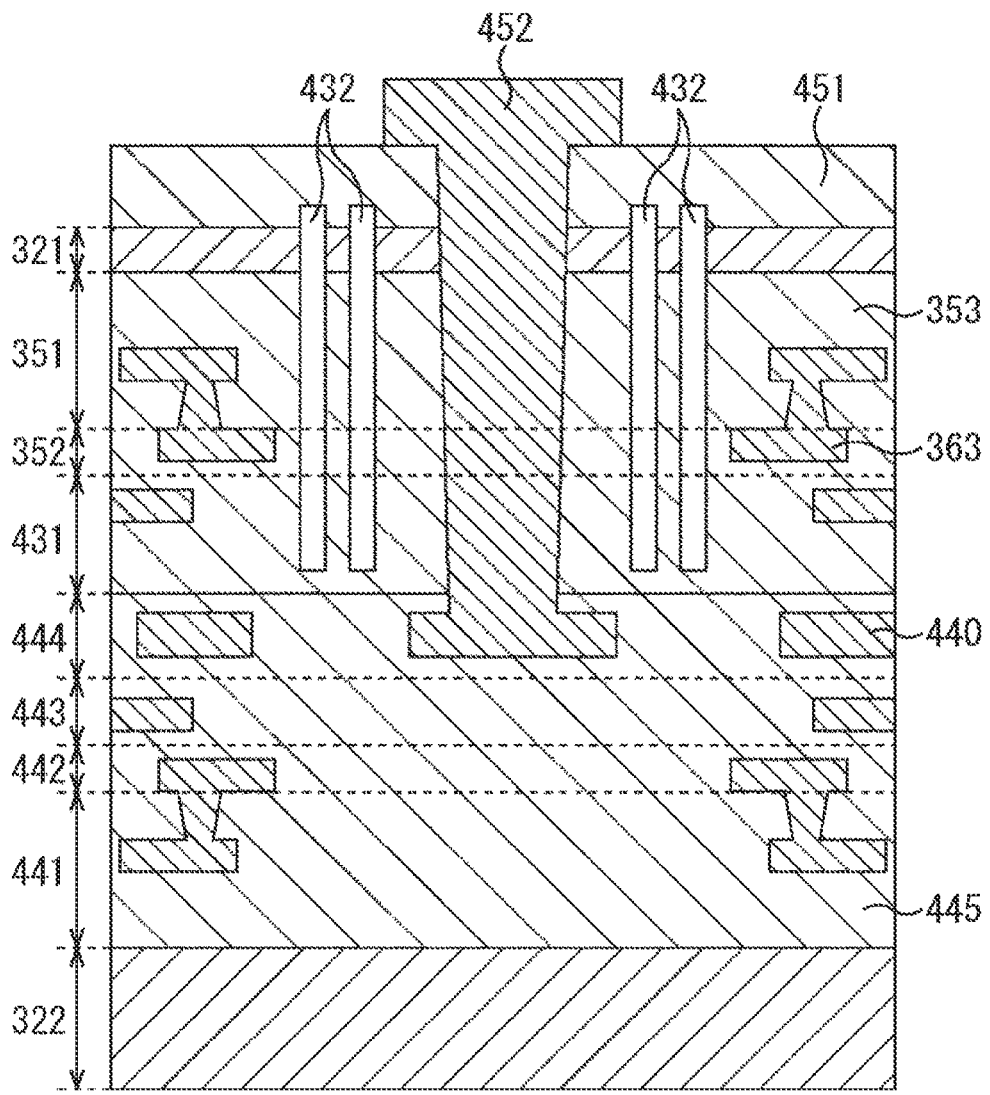
FIG. 31 is a diagram for describing the second method of manufacturing the CMOS image sensor in FIG. 8.

In a fourth process in FIG. 31, regions of the insulating film 451, the semiconductor substrate 321, the insulating film 353, and the insulating film 445 in which regions the TSV 452 is to be formed are etched, and the TSV 452 is formed.

Figure 32:
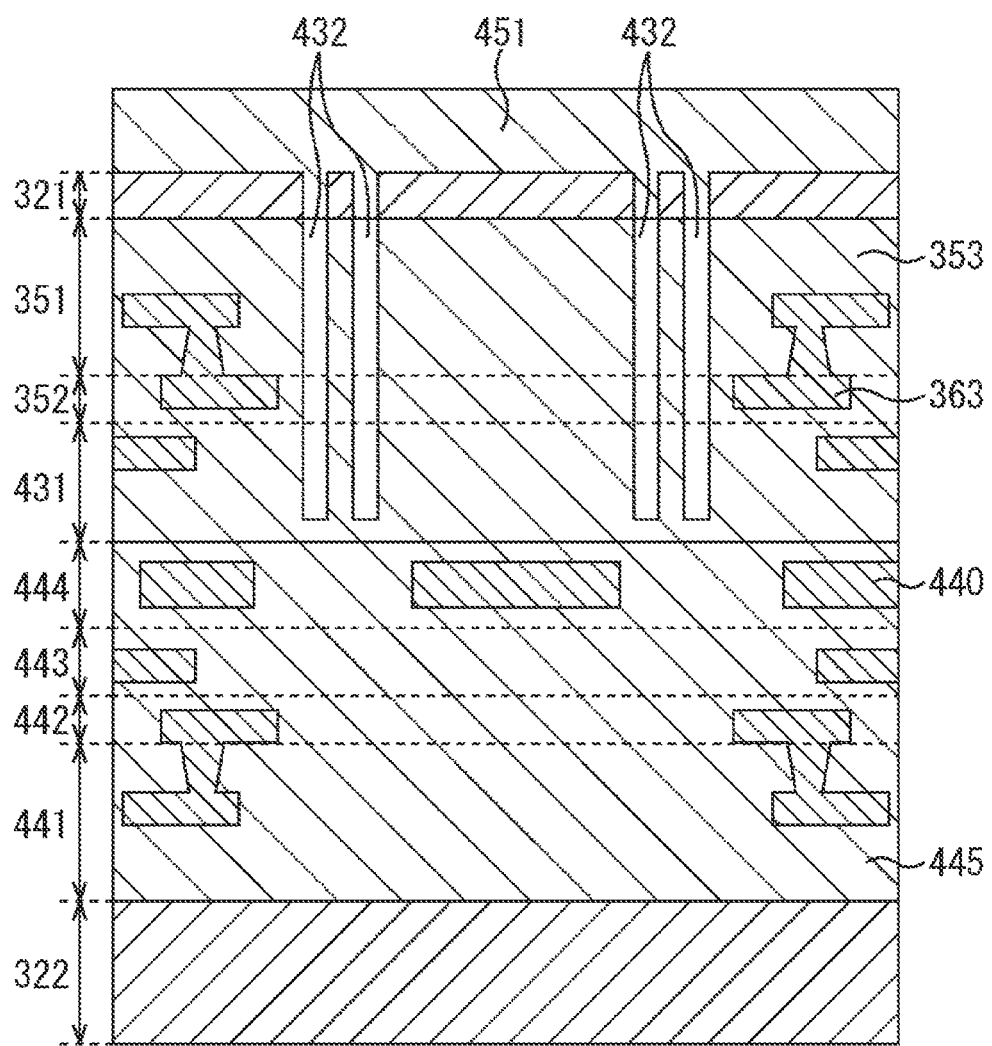
FIG. 32 is a diagram depicting other structure example of a hollow region around a through-silicon via (TSV).

As depicted in FIG. 32, in the third process, at the time of forming the insulating film 451, the insulating film 451 may be buried in the hollow regions 432 in the semiconductor substrate 321. Further, the TSV 452 may connect, by one via or two vias, the wiring 440 of the wiring layer 444 to the wiring 363 of the wiring layer 351.

As described above, by forming the hollow regions 432 around the TSV 452, the capacitance between the TSV 452 and the potential portion of the semiconductor substrate 321 (for example, GND) can be reduced.

In the third embodiment, the hollow regions 364A to 364O and the hollow regions 432 may be in any number equal to one or more. The hollow regions 364A to 364O and the hollow regions 432 may have any shape in which the insulating film is not formed by a film forming method of poor coverage.

Fourth Embodiment (Description of Arrangement of Hollow Regions in Pixel Region)
The configuration and structure of a CMOS image sensor as a solid-state image-capturing element according to a fourth embodiment of the present disclosure are the same as the configuration and structure of the CMOS image sensor 320, except that the CMOS image sensor in the fourth embodiment has the FD 93 shared among 2 (horizontal)×2 (vertical) pixels 90 and that the arrangement and shapes of the hollow regions 364A to 364C and the hollow regions 432 are different.

Therefore, only the arrangement and shapes of the hollow regions 364A to 364C and the hollow regions 432 are described below. Further, in the subsequent drawings, parts that are the same as those of the CMOS image sensor 320 are attached with the same reference signs. Redundant description will be omitted as appropriate.

Figure 33A:
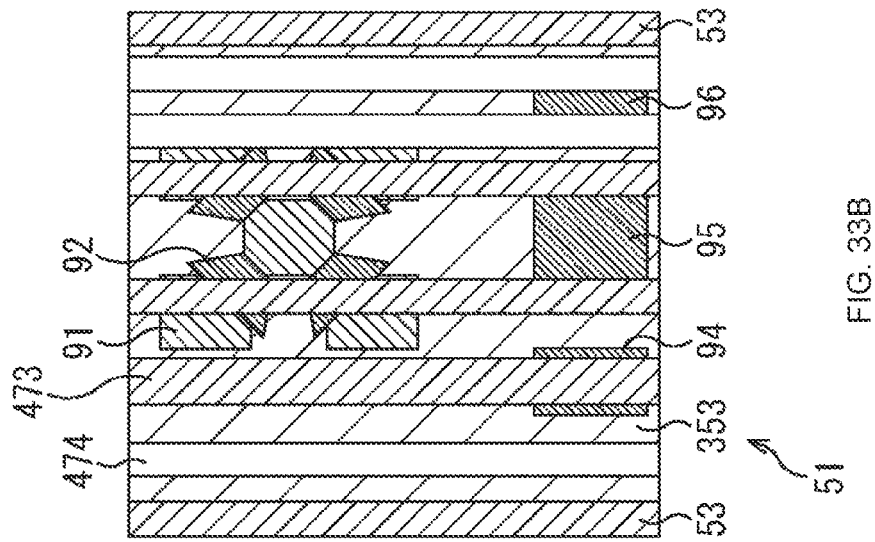
FIGS. 33A and 33B are plan views for describing the arrangement of hollow regions of a CMOS image sensor according to a fourth embodiment.
Figure 33B:
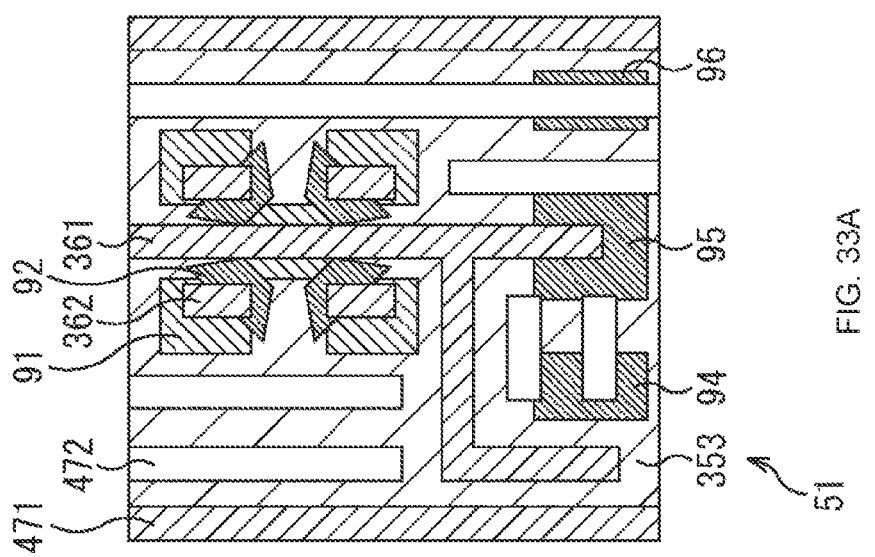

FIGS. 33A and 33B are plan views for describing the arrangement of the hollow regions in the pixel region 51 of the CMOS image sensor according to the fourth embodiment. FIGS. 33A and 33B are plan views, looked at from the wiring layer 431 side, of the pixel region 51 of the semiconductor substrate 321 on which the wiring layer 351, the wiring layer 352, and the wiring layer 431 are stacked.

FIG. 33A depicts only the semiconductor substrate 321 and the wiring layer 351, and FIG. 33B depicts only the semiconductor substrate 321 and the wiring layer 431.

As depicted in FIG. 33A, in the CMOS image sensor according to the fourth embodiment, hollow regions 472 are formed between the FD wiring 361 and other wiring such as a wiring 471 in the same wiring layer 351. With this arrangement, the dielectric constant between the FD wiring 361 and other wiring in the wiring layer 351 is reduced, and the capacitance of the FD wiring 361 is reduced. As a result, the charge-voltage conversion efficiency is improved.

Further, as depicted in FIG. 33B, in the wiring layer 431, hollow regions 474 are formed between the vertical signal lines 53 and other wiring such as a wiring 473 in the same wiring layer 431. With this arrangement, the dielectric constant between the vertical signal lines 53 and other wiring in the wiring layer 431 is reduced, and the capacitances of the vertical signal lines 53 are reduced. As a result, a delay in the reading of pixel signals can be prevented.

In the example of FIG. 33A, two hollow regions 472 are formed between the FD wiring 361 and other wiring. The hollow regions 472 can be in any number equal to or larger than one. Similarly, the hollow regions 474 formed between the vertical signal lines 53 and other wiring can be in any number equal to or larger than one.

In the example in FIGS. 33A and 33B, the hollow regions 472 and the hollow regions 474 are each in a rectangular shape (a stripe shape) when looked at from above the wiring layer 431. However, the hollow regions 472 and the hollow regions 474 can each have any shape.

Figure 34B:
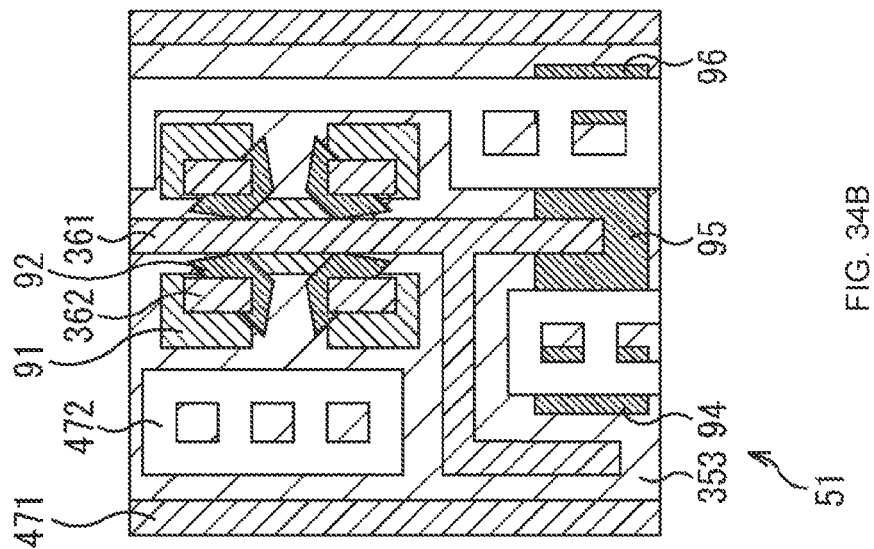
FIGS. 34A and 34B are diagrams depicting an example of other shape of hollow regions around an FD wiring in FIGS. 33A and 33B.
Figure 34A:
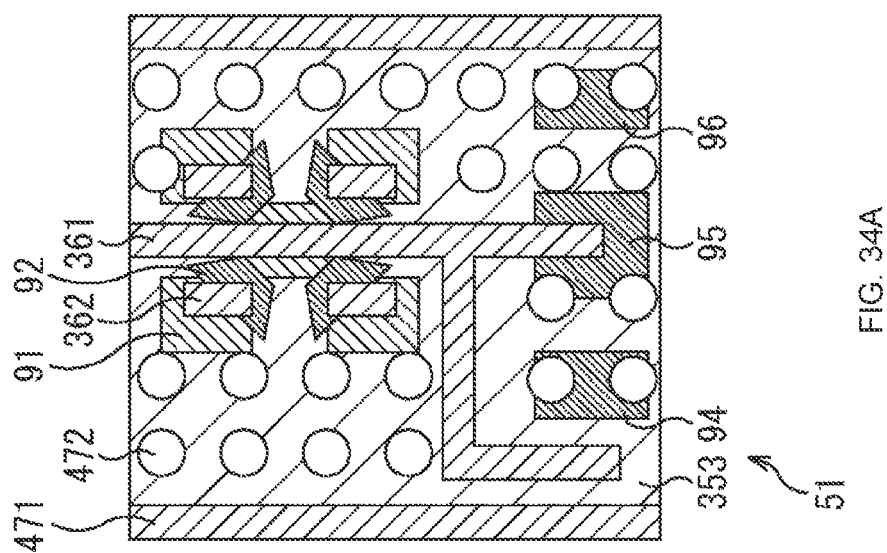

(Example of Shape of Hollow Region in Pixel Region)
FIGS. 34A and 34B are plan views, looked at from the wiring layer 351 side, of the pixel region 51 of the semiconductor substrate 321 on which the wiring layer 351 is stacked, depicting other example of the shape of the hollow region 472.

Each of the hollow regions 472 may be in a circle shape (a hole shape) when looked at from above the wiring layer 351, as depicted in FIG. 34A, or may be in a mesh (a mesh shape), as depicted in FIG. 34B, for example.

Although not depicted, each of the hollow regions 474 can also be in the same shape as the hollow region 472.

Figure 35A:
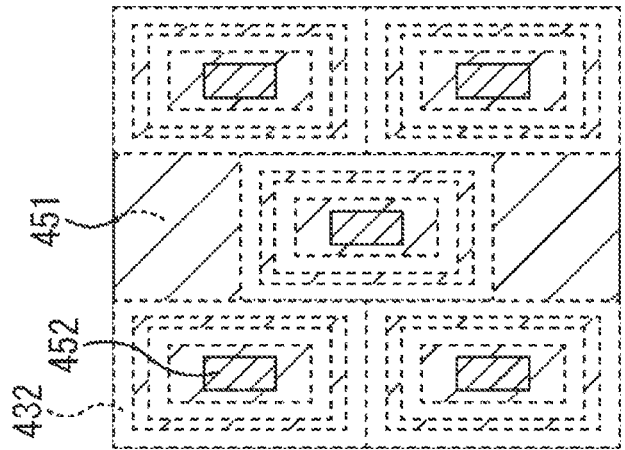
FIGS. 35A, 35B, and 35C are plan views depicting an example of the shape of hollow regions formed around the TSV.
Figure 35B:
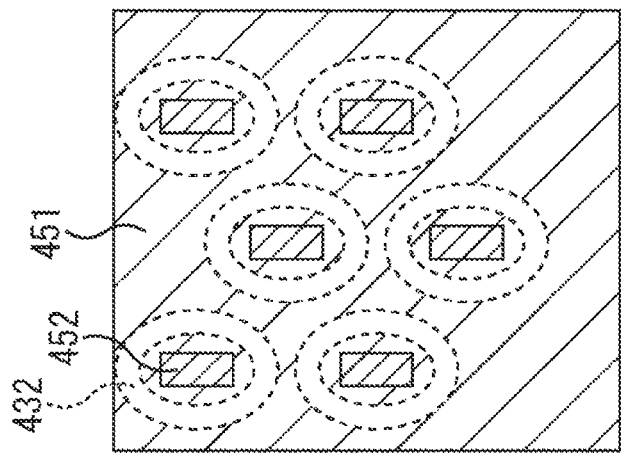
Figure 35C:
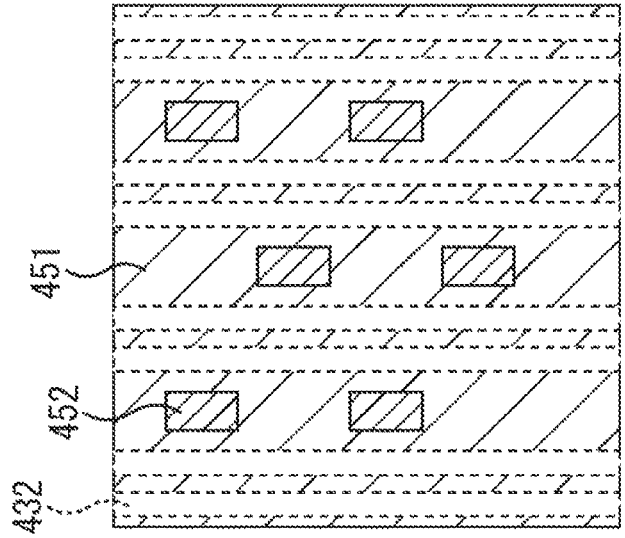

(Example of Shape of Hollow Region in Other than Pixel Region)
FIGS. 35A, 35B, and 35C are plan views of a CMOS image sensor according to the fourth embodiment looked at from above the insulating film 451, depicting an example of the shape of each of the hollow regions 432 formed around the TSV 452 other than the pixel region 51 of the CMOS image sensor.

Each hollow region 432 may be in a rectangular ring shape when looked at from above the insulating film 451, as depicted in FIG. 35A, or may be in a circular ring shaped, as depicted in FIG. 35B, for example. Further, each hollow region 432 may be in a linear shape (a stripe shape), as depicted in FIG. 35C.

The number of the hollow regions 432 formed around the TSV 452 is two in the examples of FIGS. 35A and 35C, and one in the example of FIG. 35B. However, the number of the hollow regions 432 is not limited to these numbers, and can be any number.

The shape of the hollow regions 432, the hollow regions 472, and the hollow regions 474 is not limited to the shapes depicted in FIGS. 34A, 34B, 35A, 35B, and 35C, so far as the hollow region has a shape in which an insulating film is not formed by a film forming method of poor coverage.

Further, in the fourth embodiment, a hollow region may also be formed in the lower and upper parts of the FD wiring 361, in a manner similar to that in the third embodiment.

Further, in the third embodiment, a hollow region may be formed around the vertical signal lines 53, in a manner similar to that in the fourth embodiment. In the third and fourth embodiments, the region in which the hollow region is formed may be around the wiring of which the capacitance is desired to be reduced, other than the FD wiring 361 and the vertical signal lines 53.

In the third and fourth embodiments, a hollow region may be formed in the semiconductor substrate 322.

Figure 36:
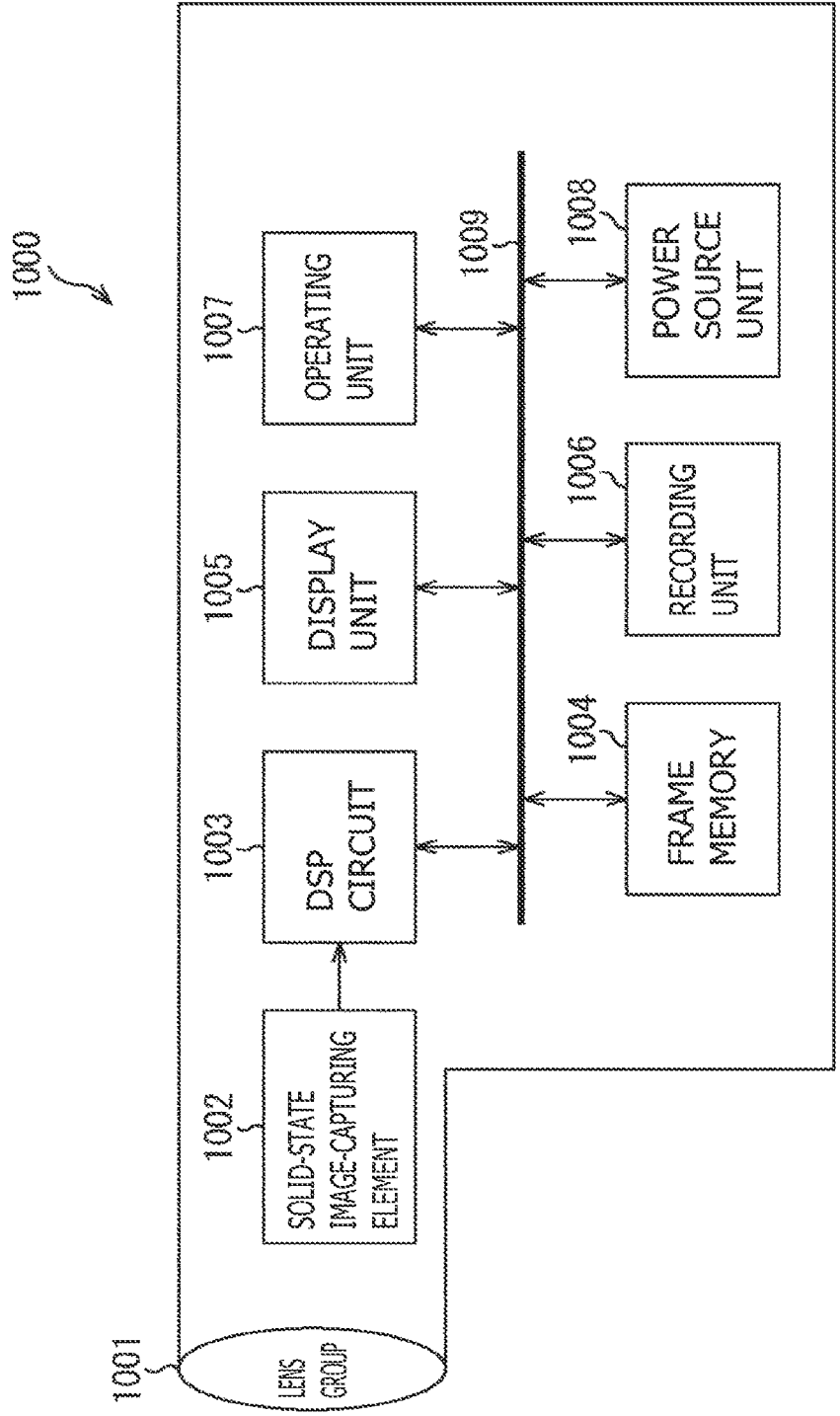
FIG. 36 is a block diagram depicting a configuration example of an image-capturing device as an electronic device according to the present disclosure.
Figure 37:
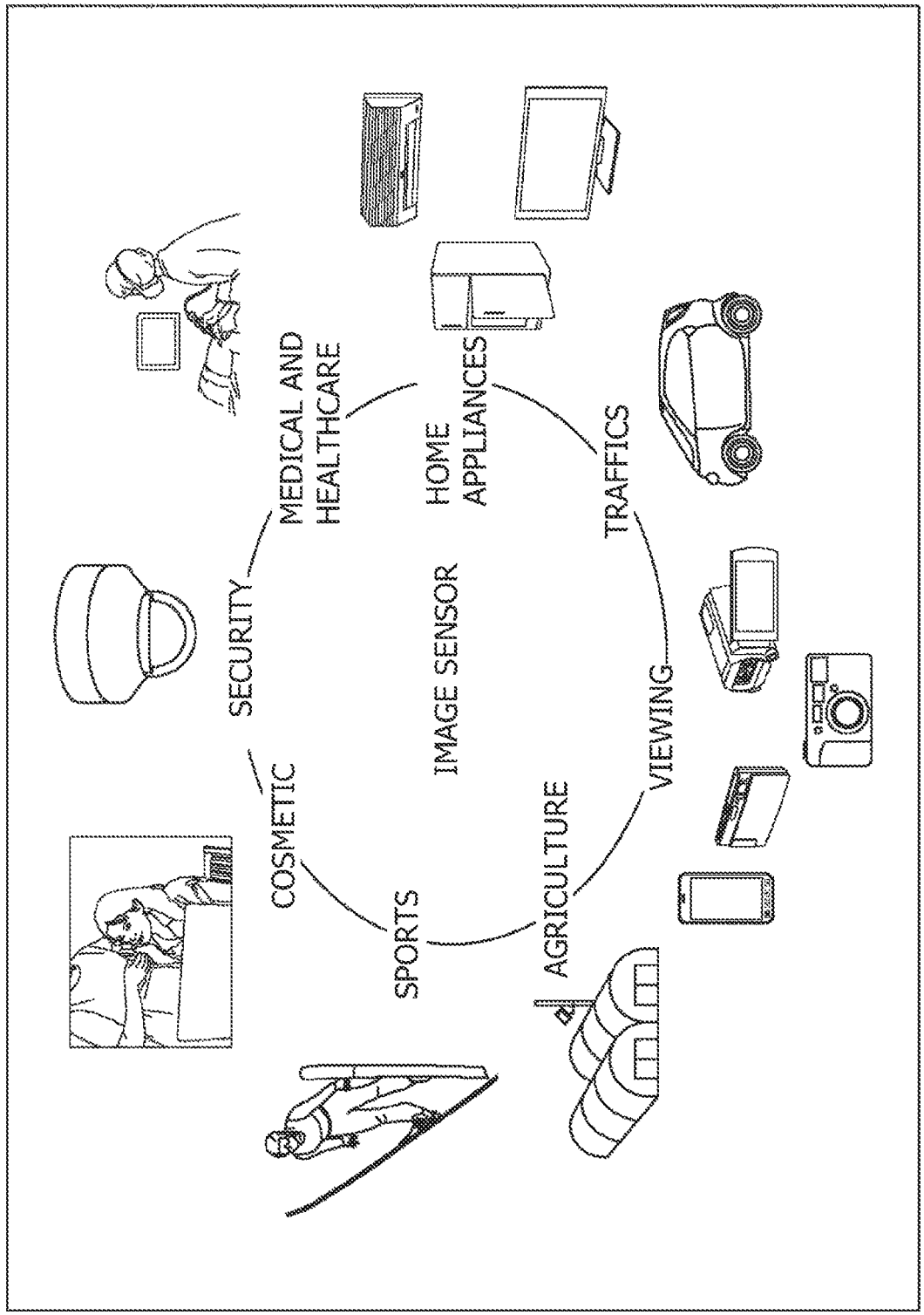
FIG. 37 is a diagram depicting an example of usage of a CMOS image sensor described above.

Fifth Embodiment (Configuration Example of Image-Capturing Device According to One Embodiment)
FIG. 36 is a block diagram depicting a configuration example of an image-capturing device as an electronic device in one embodiment according to the present disclosure.

An image-capturing device 1000 in FIG. 36 is a video camera, a digital still camera, or the like. The image-capturing device 1000 includes a lens group 1001, a solid-state image-capturing element 1002, a digital signal processing (DSP) circuit 1003, a frame memory 1004, a display unit 1005, a recording unit 1006, an operating unit 1007, and a power source unit 1008. The DSP circuit 1003, the frame memory 1004, the display unit 1005, the recording unit 1006, the operating unit 1007, and the power source unit 1008 are connected to one another via a bus line 1009.

The lens group 1001 captures light (image light) incident from a subject, and forms an image on the image-capturing surface of the solid-state image-capturing element 1002. The solid-state image-capturing element 1002 includes the CMOS image sensor described above. The solid-state image-capturing element 1002 converts in pixel unit the quantity of the incident light that forms the image on the image-capturing surface by the lens group 1001, into an electric signal, and supplies the electric signal to the DSP circuit 1003 as a pixel signal.

The DSP circuit 1003 performs predetermined image processing to the pixel signal supplied from the solid-state image-capturing element 1002, supplies the processed image signal in frame unit to the frame memory 1004, and temporarily stores the image signal in the frame memory 1004.

The display unit 1005 incudes, for example, a panel-type display device such as a liquid crystal panel or an organic electro luminescence (EL) panel, and displays an image, based on the frame-unit pixel signal that is temporarily stored in the frame memory 1004.

The recording unit 1006 includes a digital versatile disk (DVD), a flash memory, and the like, reads out the frame-unit pixel signal temporarily stored in the frame memory 1004, and records the pixel signal.

The operating unit 1007, under the operation of a user, issues operation instructions regarding various functions of the image-capturing device 1000. The power source unit 1008 appropriately supplies power to the DSP circuit 1003, the frame memory 1004, the display unit 1005, the recording unit 1006, and the operating unit 1007.

The electronic device to which the present technique is applied may be a device that uses a CMOS image sensor in the image-capturing unit (a photoelectric conversion unit). The technique can be applied to a portable terminal device having an image-capturing function, and a copying machine using a CMOS image sensor in the image reading unit, in addition to the image-capturing device 1000.

<Example of Usage of CMOS Image Sensor>

FIG. 37 is a diagram depicting an example of usage of the above CMOS image sensor.

The CMOS image sensor described above can be used for various cases, such as for sensing visible light, infrared light, ultraviolet light, light of X-rays, as described below, for example.

- A device provided for capturing an image for viewing, such as a digital camera, and a mobile device with a camera function
- A device provided for traffics, such as an on-vehicle sensor that photographs the front, the back, the surrounding, and the inside of the automobile, for safe driving such as automatic stop and for recognition of the state of the driver, a monitoring camera that monitors a running vehicle and the road, and a distance measuring sensor that measures a distance between vehicles
- A device provided for home appliances such as a television set, a refrigerator, and an air conditioner, for photographing a gesture of the user so as to operate the home appliances in accordance with the gesture
- A device provided for medical and healthcare, such as an endoscope and apparatus that performs angiography by receiving infrared light
- A device provided for security, such as a monitoring camera for crime prevention and a camera for person authentication
- A device provided for cosmetic use, such as a skin measuring device that captures an image of the skin and a microscope that captures an image of the scalp
- A device provided for sports, such as an action camera and a wearable camera for sports application
- A device provided for agriculture, such as a camera that monitors the state of fields and crops The effects described in the present specification are illustrative and are not intended to be limited. There may be other effects.

Further, the embodiments of the present disclosure are not intended to be limited to the embodiments described above, and various modifications are possible without departing from the scope of the present disclosure.

The present disclosure can also be applied to a charge coupled device (CCD) image sensors, without being limited to the CMOS image sensor.

The present disclosure can also be configured as follows.

(1)

A solid-state image-capturing element in which at least a part of a region between an FD wiring connected to a floating diffusion and a wiring other than the FD wiring is a hollow region.

(2)

The solid-state image-capturing element according to (1) above, wherein the FD wiring and the hollow region are in contact with each other.

(3)

The solid-state image-capturing element according to (1) above, wherein the FD wiring and the hollow region are not in contact with each other.

(4)

The solid-state image-capturing element according to one of (1) to (3) above, wherein the hollow region is a region other than a region between the FD wiring and a TRG wiring connected to a transfer transistor, out of a region between the FD wiring and the wiring other than the FD wiring.

(5)

The solid-state image-capturing element according to one of (1) to (4) above, wherein at least a part of a surrounding of a vertical signal line is a hollow region.

(6)

The solid-state image-capturing element according to one of (1) to (5) above, wherein the FD wiring is one of a plurality of FD wirings connected individually to a plurality of floating diffusions.

(7)

The solid-state image-capturing element according to (1) above, wherein the number of the hollow region is a plurality.

(8)

The solid-state image-capturing element according to (1) or (7) above, wherein an insulating film is formed in a region other than the hollow region, out of the region between the FD wiring and the wiring other than the FD wiring.

(9)

The solid-state image-capturing element according to (8) above, wherein a material of an insulating film formed around an upper part of the hollow region and a material of an insulating film formed around a lower part of the hollow region are different.

(10)

The solid-state image-capturing element according to (9) above, wherein a size of the lower part of the hollow region is larger than a size of the upper part.

(11)

The solid-state image-capturing element according to (10) above, wherein the number of the hollow region is a plurality, and lower parts of the plurality of hollow regions are connected together.

(12)

The solid-state image-capturing element according to one of (1) and (7) to (11) above, wherein at least a part of a region between the FD wiring and a semiconductor substrate in contact with the FD wiring is a hollow region.

(13)

The solid-state image-capturing element according to one of (1) and (7) to (11) above, including:

a first semiconductor substrate on which there are stacked the FD wiring, the wiring other than the FD wiring, and a wiring layer in which the hollow region is formed; a second semiconductor substrate bonded to the first semiconductor substrate; and a connection section that electrically connects the first semiconductor substrate to the second semiconductor substrate, wherein
a hollow region is formed around the connection section of the wiring layer.

(14)
The solid-state image-capturing element according to (13) above, wherein the hollow region formed around the connection section of the wiring layer pierces through the first semiconductor substrate.

(15)
An electronic device including:
a solid-state image-capturing element in which at least a part of a region between an FD wiring connected to a floating diffusion and a wiring other than the FD wiring is a hollow region.

(16)
A solid-state image-capturing element including:
a first semiconductor substrate;
a second semiconductor substrate bonded to the first semiconductor substrate; and
a connection section that electrically connects the first semiconductor substrate to the second semiconductor substrate, wherein
a hollow region is formed around the connection section of a wiring layer stacked on the first semiconductor substrate.

REFERENCE SIGNS LIST

50 CMOS image sensor, 53 Vertical signal line, 92 Transfer transistor, 93 FD, 132 FD wiring, 133 Wiring, 134 TRG wiring, 135, 201 to 206, 221, 241 Hollow region, 301, 302 FD, 320 CMOS image sensor, 321, 322 Semiconductor substrate, 351, 352 Wiring layer, 353 Insulating film, 361 FD wiring, 364A to 364C Hollow region, 421 Insulating film, 432 Hollow region, 452 TSV, 1000 Image-capturing device, 1002 Solid-state image-capturing element

The invention claimed is:

1. A semiconductor device, comprising:
a semiconductor substrate including an impurity region; and
a wiring layer including:
a first via connected to the impurity region;
a second via;
a first hollow region, wherein
the first hollow region is between the first via and the second via, and
the first via is not in contact with the first hollow region; and
a second hollow region, wherein the second via is between the first via and the second hollow region.

2. The semiconductor device according to claim 1, further comprising an amplification transistor, wherein the second via is connected to the amplification transistor.

3. The semiconductor device according to claim 1, wherein
the second via is between the first hollow region and the second hollow region.

4. The semiconductor device according to claim 3, wherein the second via is not in contact with each of the first hollow region and the second hollow region.

5. The semiconductor device according to claim 3, wherein the first via, the first hollow region, the second via, and the second hollow region are in this order in a specific direction.

6. The semiconductor device according to claim 5, wherein the specific direction is a horizontal direction.

7. The semiconductor device according to claim 3, wherein
the wiring layer further includes a third via, and
the second hollow region is between the second via and the third via.

8. The semiconductor device according to claim 7, further comprising a power source, wherein the third via is connected to the power source.

9. The semiconductor device according to claim 1, further comprising:
a photodiode; and
a transfer transistor, wherein the photodiode is connected to the impurity region via the transfer transistor.

10. The semiconductor device according to claim 1, wherein a part of the first hollow region is between the first via and the second via.

11. A semiconductor device, comprising:
a semiconductor substrate including an impurity region; and
a wiring layer including:
a first via connected to the impurity region;
a second via; and
a first hollow region, wherein
the first hollow region is between the first via and the second via, and
the first via is not in contact with the first hollow region.

12. A semiconductor device, comprising:
a semiconductor substrate including an impurity region; and
a wiring layer including:
a first via connected to the impurity region;
a second via;
a first hollow region, wherein
the first hollow region is between the first via and the second via;
a second hollow region, wherein
the second via is between the first via and the second hollow region, and
the second via is between the first hollow region and the second hollow region; and
a third via, wherein and the second hollow region is between the second via and the third via.

* * * * *